US012588566B2

(12) United States Patent
Yoo et al.

(10) Patent No.: US 12,588,566 B2
(45) Date of Patent: Mar. 24, 2026

(54) DISPLAY DEVICE AND MANUFACTURING METHOD THEREOF

(71) Applicant: Samsung Display Co., LTD., Yongin-si (KR)

(72) Inventors: Jae Woong Yoo, Yongin-si (KR); Jin Hyuk Jang, Yongin-si (KR); Sang Ho Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 365 days.

(21) Appl. No.: 18/348,995

(22) Filed: Jul. 7, 2023

(65) Prior Publication Data

US 2024/0038748 A1     Feb. 1, 2024

(30) Foreign Application Priority Data

Jul. 26, 2022     (KR) ........................ 10-2022-0092754

(51) Int. Cl.
H01L 25/16 (2023.01)
H10H 20/819 (2025.01)

(52) U.S. Cl.
CPC ......... *H01L 25/167* (2013.01); *H10H 20/819* (2025.01)

(58) Field of Classification Search
CPC . H01L 25/167; H01L 25/0753; H10H 20/819; H10H 20/857; H10H 20/0364;
(Continued)

(56) References Cited

U.S. PATENT DOCUMENTS 11,101,257 B2     8/2021   Kim et al.
2020/0066699 A1*   2/2020   Kim ..................... H10H 20/857
2021/0376045 A1*  12/2021   Lee ..................... H10K 59/121

FOREIGN PATENT DOCUMENTS

CN          113488571 A     10/2021
KR        10-1674052 B1     11/2016
KR    10-2020-0022061 A      3/2020

OTHER PUBLICATIONS

K. Kohler et al., "Control of the Mg doping profile in III-N light-emitting diodes and its effect on the electroluminescence efficiency", Journal of Applied Physics 97, 104914, May 10, 2005.
(Continued)

*Primary Examiner* — Elmito Breval
(74) *Attorney, Agent, or Firm* — Womble Bond Dickinson (US) LLP

(57) ABSTRACT

A display device including: electrodes on a base layer; an insulating layer on the electrodes and including a first protruding pattern and a second protruding pattern; light emitting elements on the insulating layer, a light emitting element from among the light emitting elements including a first end and a second end, wherein the light emitting elements include a first light emitting element, the first end of the first light emitting element being adjacent to the first protruding pattern, and the second end of the first light emitting element being adjacent to the second protruding pattern; a first connecting electrode electrically connected to the first end of the first light emitting element and including a first base portion and first protruding portions connected to the first base portion; and a second connecting electrode electrically connected to the second end of the first light emitting element.

20 Claims, 28 Drawing Sheets

DA(PXL)

ELT: ELTA, ELTC
ALE: ALE1, ALE2
ELTA(ELT1): B1, P1
ELTC(ELT2): B2, P2

(58) Field of Classification Search
    CPC .. H10H 20/8513; H10H 20/01; H10H 20/032;
        H10H 20/036; H10H 20/8314; H10H
        29/142; H10D 86/021; H10D 86/441;
                                    H10D 86/451
    See application file for complete search history.

(56) References Cited

OTHER PUBLICATIONS

C. Youtsey et al., "Dopant-Selective Photoenhanced Wet Etching of
GaN", Journal of Electronic Materials, vol. 27, No. 4, Apr. 1998.

* cited by examiner

PXL(SPXL): SPXL1, SPXL2, SPXL3

DA(PXL)

CNT1  A  EMA  A'  CNT2  NEA

EP1  LD  EP2

ELTA(ELT1)  ELTC(ELT2)

P1  P2

B1  B2

SCL1  AL  SCL2

EMU  OPN

BNK

DR2
DR1
DR3

ALE1  ALE2

ELT: ELTA, ELTC
ALE: ALE1, ALE2
ELTA(ELT1): B1, P1
ELTC(ELT2): B2, P2

FIG. 9

CCL: CCL1, CCL2, LSL
CFL: CF1, CF2, CF3

ALE: ALE1, ALE2
ELT: ELT1, ELT2
INP: INP1, INP2
BNK: BNK1, BNK2

DA(PXL)

ELTA(ELT1)

ELTC(ELT2)

B

B'''

EP1

AL   LD

EP2

C

C'

120

P1

140

P2

B1

B2

IP1(IPP1)

SCL1   SCL2

IP2(IPP2)

B'

B''

DR2

DR1

DR3

ELT: ELTA, ELTC
ELTA(ELT1): B1, P1
ELTC(ELT2): B2, P2
IP: IP1, IP2

FIG. 15

ELT: ELTA, ELTC
ELTA(ELT1): B1, P1
ELTC(ELT2): B2, P2
ALE: ALE1, ALE2
IP: IP1, IP2
INS: IP, INS1

ELT: ELTA, ELTC
ELTA(ELT1): B1, P1
ELTC(ELT2): B2, P2
IP: IP1, IP2

FIG. 18

ELT: ELTA, ELTC
ELTA(ELT1): B1, P1
ELTC(ELT2): B2, P2
ALE: ALE1, ALE2
IP: IP1, IP2
INS: IP, INS1

ELT: ELTA, ELTC
ELTA(ELT1): B1, P1
ELTC(ELT2): B2, P2
ALE: ALE1, ALE2
INS: IP, INS1

ELT: ELTA, ELTC
ELTA(ELT1): B1, P1
ELTC(ELT2): B2, P2, IS
IP: IP1, IP2

FIG. 26

ALE: ALE1, ALE2
INP: INP1, INP2

ALE1

ALE2

120

140

IP1(IPP1)

IP2(IPP2)

DR2

DR3 — DR1

ALE: ALE1, ALE2
IP: IP1, IP2

FIG. 28

BNK1

INS(INS1)

BSL/PCL

LD(LD_N)

EP1    EP2

INP2

ALE2

ALE1

INP1

BNK1

ALE: ALE1, ALE2
INP: INP1, INP2

A'

A

DR3

ALE: ALE1, ALE2
ELT: ELT1, ELT2
INP: INP1, INP2

DISPLAY DEVICE AND MANUFACTURING METHOD THEREOF

CROSS-REFERENCE TO RELATED APPLICATION

This application claims priority to and the benefit of Korean Patent Application No. 10-2022-0092754 filed in the Korean Intellectual Property Office on Jul. 26, 2022, the entire content of which is incorporated by reference herein.

BACKGROUND

1. Field

The present disclosure relates to a display device and a manufacturing method thereof.

2. Description of the Related Art

Recently, as interest in an information display is increasing, research and development for display devices are continuously conducted.

SUMMARY

Aspects and features of embodiments of the present disclosure relate to a display device and a manufacturing method thereof in which electrical connection structures for light emitting elements may be normally defined.

Also, aspects and features of embodiments of the present disclosure relate to a display device and a manufacturing method thereof in which process quality with respect to positions in which light emitting elements are aligned may be predicted (e.g., easily predicted).

One or more embodiments of the present disclosure provide a display device including: electrodes on a base layer; an insulating layer on the electrodes and including a first protruding pattern and a second protruding pattern; light emitting elements on the insulating layer, a light emitting element from among the light emitting elements including a first end and a second end, wherein the light emitting elements include a first light emitting element, the first end of the first light emitting element being adjacent to the first protruding pattern, and the second end of the first light emitting element being adjacent to the second protruding pattern; a first connecting electrode electrically connected to the first end of the first light emitting element and including a first base portion and first protruding portions connected to the first base portion; and a second connecting electrode electrically connected to the second end of the first light emitting element and including a second base portion and second protruding portions connected to the second base portion. The light emitting elements include a first surface having a first area at the first end and a second surface having a second area smaller than the first area at the second end. The first protruding pattern may include first protruding spacing patterns spaced from each other by a first distance with one of the first protruding portions therebetween. The second protruding pattern may include second protruding spacing patterns spaced from each other by a second distance with one of the second protruding portions therebetween. The first distance may be greater than the second distance.

The light emitting element may include a first semiconductor layer adjacent to the first end and including a p-type semiconductor; a second semiconductor layer adjacent to the second end and including an n-type semiconductor; and an active layer between the first semiconductor layer and the second semiconductor layer. The light emitting element may have an asymmetrical shape with respect to a direction from the first end toward the second end.

The first protruding portions and the second protruding portions may respectively form pairs.

The first protruding portion may overlap the first end of the light emitting element in a plan view. The second protruding portion may overlap the second end of the light emitting element in the plan view.

The display device may include a first power line configured to supply a first power voltage to the first light emitting element; and a second power line configured to supply a second power voltage different from the first power voltage to the first light emitting elements. The first connecting electrode may electrically connect the first power line and the first end of the first light emitting element. The second connecting electrode may electrically connect the second power line and the second end of the first light emitting element.

The first end of the first light emitting element may contact the first protruding portion without physically contacting the first base portion. The second end of the first light emitting element may contact the second protruding portion without physically contacting the second base portion.

The first protruding spacing patterns may form a first groove area. The second protruding spacing patterns may form a second groove area. The insulating layer may include a first insulating film covering the electrodes. A portion of the first end of the first light emitting element may contact the first insulating film in the first groove area. A portion of the second end of the first light emitting element may contact the second insulating film in the second groove area.

The first protruding spacing patterns may be between the first protruding portions. The second protruding spacing patterns may be between the second protruding portions.

One of the first protruding spacing patterns may be between the first protruding portions. One of the second protruding spacing patterns may be between the second protruding portions.

The first protruding spacing patterns may have a first length. The second protruding spacing patterns may have a second length. The first length may be smaller than the second length.

One or more of the first protruding spacing patterns and one or more of the second protruding spacing patterns may be integrally formed to provide a protruding spacing pattern extending in a direction from the first end toward the second end.

The protruding spacing pattern may have a trapezoidal shape. A diagonal direction in which a side surface of the protruding spacing pattern extends may be same as a diagonal direction in which a side surface of the first light emitting elements extends.

The light emitting elements may include a second light emitting element, wherein the first end of the second light emitting element facing the second connecting electrode and the second end of the second light emitting element facing the first connecting electrode. The second light emitting elements do not correspond to a pair formed by the first protruding spacing patterns and the second protruding spacing patterns, and may not electrically connect the first connecting electrode and the second connecting electrode.

The light emitting elements may include a third light emitting element, the first end of the third light emitting element facing the second connecting electrode and the second end of the third light emitting element facing the first connecting electrode. The third light emitting element may be physically spaced from the second base portion, and may not electrically connect the first connecting electrode and the second connecting electrode.

The insulating layer may include a first insulating film covering the electrodes. A diameter of the first end of the third light emitting element may be smaller than a distance between the second protruding spacing patterns adjacent to each other. A portion adjacent to the first end of the third light emitting element may be on the adjacent second protruding spacing patterns to be spaced from the first insulating film.

The second connecting electrode may include an isolated portion physically spaced from the second base portion. The third light emitting elements may contact the isolated portion.

One or more embodiments of the disclosure provide a manufacturing method of a display device, including: patterning electrodes on a base layer; disposing an insulating layer on the electrodes; disposing light emitting elements on the insulating layer; and patterning connecting electrodes such that one or more of the connecting electrodes are electrically connected to the light emitting elements. The disposing of the insulating layer may include disposing a first insulating film covering the electrodes, a first protruding pattern, and a second protruding pattern. The first protruding pattern may include first protruding spacing patterns that are spaced from each other by a first distance. The second protruding pattern may include second protruding spacing patterns that are spaced from each other by a second distance. The patterning of the connecting electrodes may include: patterning a first base portion and first protruding portions connected to the first base portion; and patterning a second base portion and second protruding portions connected to the second base portion. The first protruding portions may be between the first protruding spacing patterns adjacent to each other. The second protruding portions may be between the second protruding spacing patterns adjacent to each other. The light emitting element may include a first end and a second end, and may have an asymmetrical shape with respect to a direction from the first end toward the second end. The first distance may be larger than the second distance.

The disposing of the light emitting elements may include: supplying an alignment signal to the electrodes, and aligning the light emitting elements based on an electric field according to the alignment signal. The patterning of the connecting electrodes may be performed after the patterning of the electrodes.

The disposing of the light emitting elements may include: disposing first light emitting elements; disposing second light emitting elements; and disposing third light emitting elements. The disposing of the second light emitting elements may include disposing the second light emitting elements such that they do not correspond to pairs formed by the first protruding portions and the second protruding portions. The disposing of the third light emitting elements may include disposing the first end of the third light emitting elements to be directed to the second base portion and the second end of the third light emitting elements to be directed to the first base portion.

The patterning of the connecting electrodes may include patterning an isolated portion to be adjacent to the first end of the third light emitting elements. The isolated portion may be physically spaced from the second base portion.

According to one or more embodiments of the present disclosure, an electrical connection structure for the light emitting elements may be normally defined. For example, according to one or more embodiments, an electrical connection to abnormally aligned light emitting elements may be blocked, and an electrical connection to normally aligned light emitting elements may be defined.

In addition, according to one or more embodiments of the present disclosure, process quality for the positions at which light emitting elements are aligned may be easily predicted.

BRIEF DESCRIPTION OF THE DRAWINGS

FIG. 9 illustrates a cross-sectional view taken along the line A-A' of FIG. 8.

FIG. 14 to FIG. 20 schematically illustrate structures of a pixel including protruding patterns according to one or more embodiments.

FIG. 26, FIG. 28, and FIG. 31 illustrate schematic cross-sectional views of process steps of a manufacturing method of a display device according to one or more embodiments.

DETAILED DESCRIPTION

Because the present disclosure may be variously modified and have various forms, embodiments will be illustrated and described in detail in the following. This, however, by no means restricts the present disclosure to the specific embodiments, and it is to be understood as embracing all included in the spirit and scope of the present disclosure changes, equivalents, and substitutes.

Terms such as first, second, and the like will be used only to describe various constituent elements, and are not to be interpreted as limiting these constituent elements. The terms are only used to differentiate one constituent element from other constituent elements. For example, a first constituent element could be termed a second constituent element, and similarly, a second constituent element could be termed as a first constituent element, without departing from the spirit and scope of the present disclosure. Singular forms are intended to include plural forms unless the context clearly indicates otherwise.

In the present disclosure, it should be understood that the term "include", "comprise", "have", or "configure" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance. It will be understood that when an element such as a layer, film, region, area, or substrate is referred to as being "on" another element, it can be directly on the other element or intervening elements may also be present. In addition, in the present disclosure, when a portion of a layer, film, region, area, plate, or the like is referred to as being formed "on" another portion, the formed direction is not limited to an upper direction but includes a lateral or lower direction. In contrast, when an element of a layer, film, region, area, plate, or the like is referred to as being "below" another element, it may be directly below the other element, or intervening elements may be present.

The present disclosure relates to a display device and a manufacturing method thereof. Hereinafter, a display device and a manufacturing method thereof according to one or more embodiments will be described with reference to the accompanying drawings.

Figure 1:
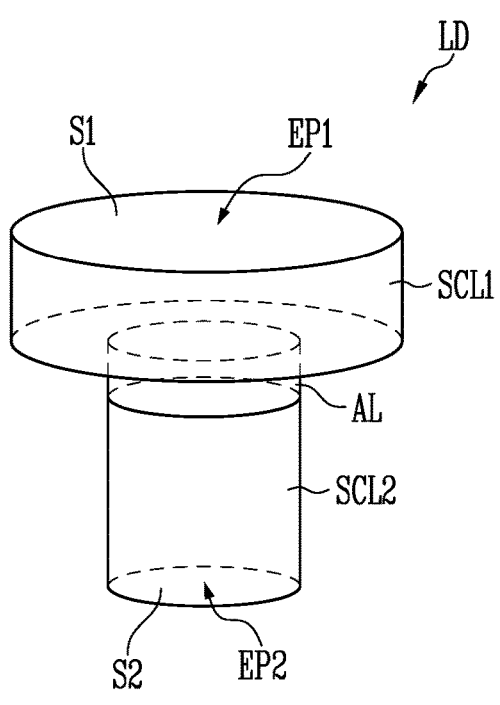
FIG. 1 to FIG. 3 schematically illustrate light emitting elements according to one or more embodiments.
Figure 2:
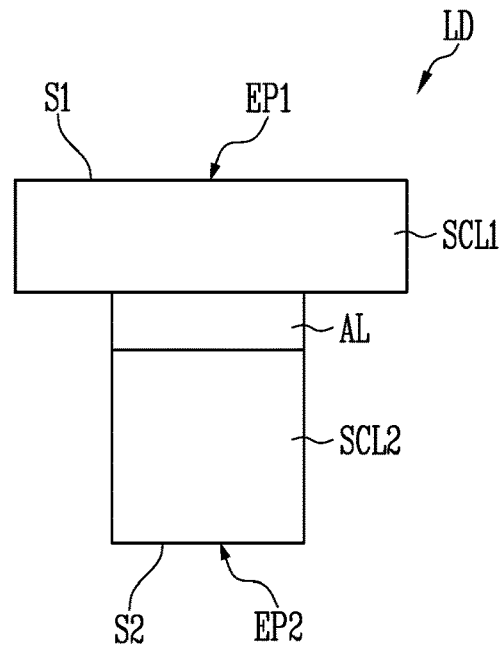
Figure 3:
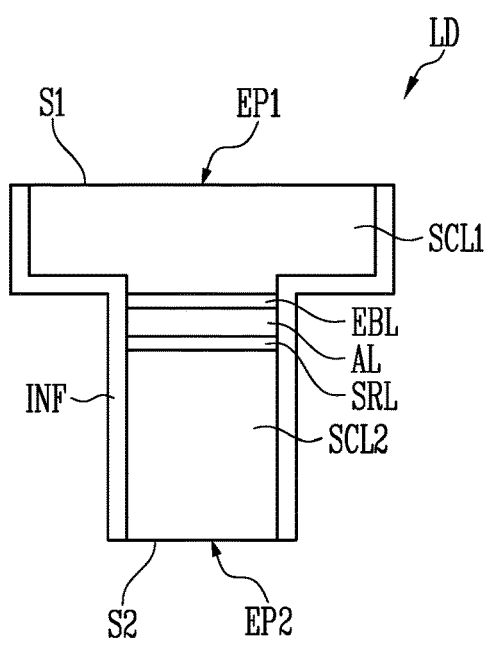
Figure 4:
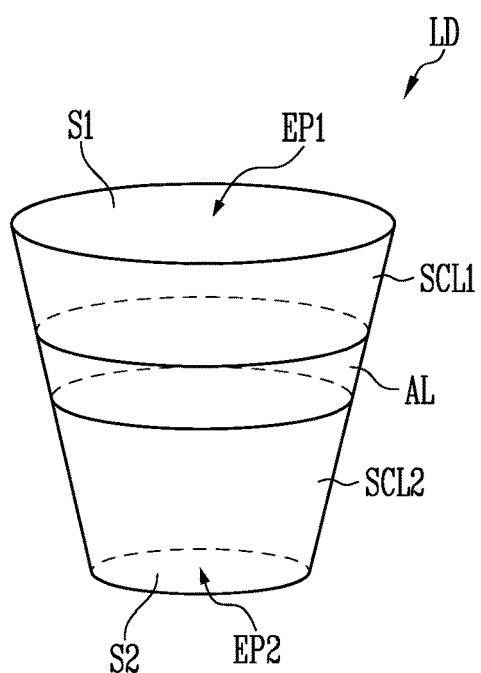
FIG. 4 to FIG. 6 schematically illustrate light emitting elements according to one or more embodiments.
Figure 5:
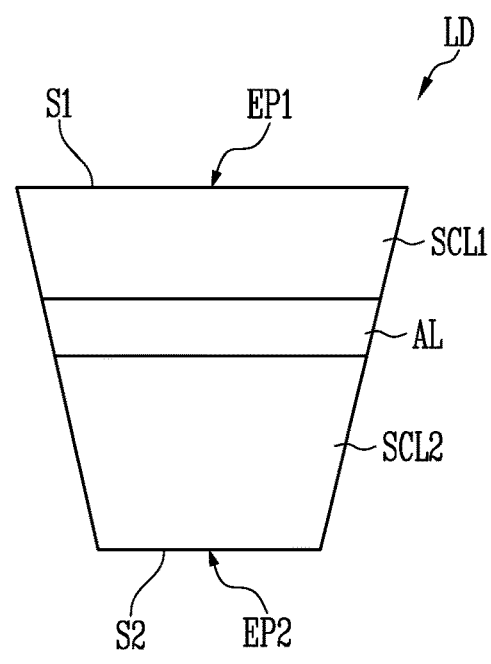
Figure 6:
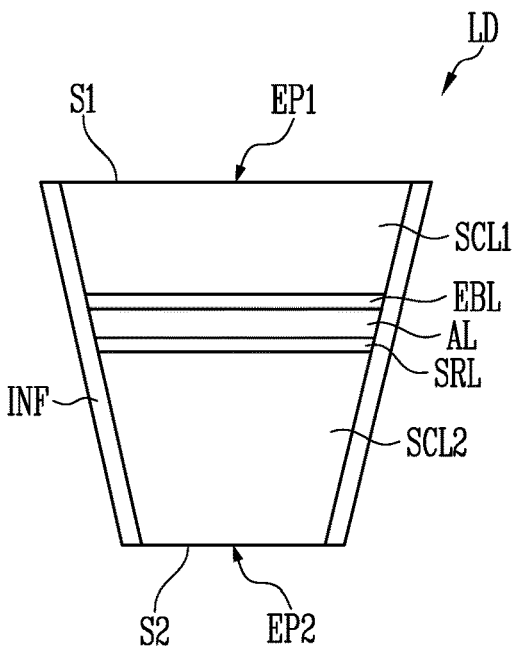

A light emitting element LD according to one or more embodiments will be described with reference to FIG. 1 to FIG. 6. FIG. 1 to FIG. 3 schematically illustrate light emitting elements according to one or more embodiments. FIG. 4 to FIG. 6 schematically illustrate light emitting elements according to one or more embodiments.

First, the light emitting element LD according to one or more embodiments will be described with reference to FIG. 1 to FIG. 3. FIG. 1 illustrates a schematic perspective view of a light emitting element LD according to one or more embodiments. FIG. 2 illustrates a schematic top plan view of the light emitting element LD according to one or more embodiments. FIG. 3 illustrates a schematic top plan view of the light emitting element LD including a partially modified structure according to one or more embodiments.

The light emitting element LD is configured to emit light. For example, the light emitting element LD may be a light emitting diode including an inorganic material.

The light emitting element LD may have an asymmetrical shape with respect to one direction (for example, a direction from a first end EP1 of the light emitting element LD toward a second end EP2 of the light emitting element LD). For example, the light emitting element LD may have a first surface S1 corresponding to the first end EP1 and a second surface S2 corresponding to the second end EP2. In this case, an area of the first surface S1 may be larger than that of the second surface S2. For example, a cross-sectional area in a cross-sectional direction (for example, a direction different from (or orthogonal to) the direction from the first end EP1 toward the second end EP2) of a first semiconductor layer SCL1 of the light emitting element LD may be larger than a cross-sectional area in the cross-sectional direction of a second semiconductor layer SCL2 thereof. Shapes of the first surface S1 and the second surface S2 are not particularly limited. For example, as shown in the drawings, the shapes of the first surface S1 and the second surface S2 may be circular. Alternatively, in one or more embodiments, the shapes of the first surface S1 and the second surface S2 may be elliptical, polygonal, or the like.

According to one or more embodiments, in order to manufacture the light emitting elements LD, an n-type semiconductor layer, a base active layer, and a p-type semiconductor layer may be stacked, and an etching process may be performed on the stacked structure. In this case, the n-type semiconductor layer provided with electrons of a relatively high ratio may be more etched than the p-type semiconductor layer. For example, depending on a type and an amount of dopants doped in each of the n-type semiconductor layer and the p-type semiconductor layer, etching selectivities may be different, and degrees to which the two semiconductor layers are etched may be different. Accordingly, the light emitting element LD according to one or more embodiments may have an asymmetric structure. In one or more embodiments, the shape of the light emitting element LD may be suitably determined by controlling process parameters and the like of the etching process.

The light emitting element LD may include a first semiconductor layer SCL1, a second semiconductor layer SCL2, and an active layer AL disposed between the first and second semiconductor layers SCL1 and SCL2. For example, the light emitting element LD may include the first semiconductor layer SCL1, the active layer AL, and the second semiconductor layer SCL2 sequentially stacked in one direction (for example, a longitudinal direction) of the light emitting element LD.

The light emitting element LD may have a size of a nano-scale to a micro-scale. For example, diameters of the first surface S1 and the second surface S2 of the light emitting element LD and a length of the light emitting element LD may have a nano-scale or a micro-scale. However, the present disclosure is not necessarily limited thereto.

The first semiconductor layer SCL1 may be adjacent to the first end EP1. The first semiconductor layer SCL1 may be a first conductive semiconductor layer. The first semiconductor layer SCL1 is disposed on the active layer AL, and may include a semiconductor layer of a type different from that of the second semiconductor layer SCL2. For example, the first semiconductor layer SCL1 may include a p-type semiconductor layer. For example, the first semiconductor layer SCL1 may include at least one semiconductor material selected from among InAlGaN, GaN, AlGaN, InGaN, AlN, and InN, and may include a p-type semiconductor layer doped with a first conductive dopant such as Mg. However, the material for forming the first semiconductor layer SCL1 is not limited thereto, and the first semiconductor layer SCL1 may be made of various suitable materials.

The active layer AL may be disposed between the first semiconductor layer SCL1 and the second semiconductor layer SCL2, and may have a single-quantum well structure or a multi-quantum well structure. The position of the active layer AL is not limited to a specific example, and may be variously changed according to a type of the light emitting element LD.

A clad layer doped with a conductive dopant may be formed at an upper portion and/or a lower portion of the active layer AL. For example, the clad layer may be formed as an AlGaN layer or an InAlGaN layer. In one or more embodiments, a material such as AlGaN and InAlGaN may be used to form the active layer AL, and in addition, various materials may form the active layer AL.

The second semiconductor layer SCL2 may be adjacent to the second end EP2. The second semiconductor layer SCL2 may be a second conductive semiconductor layer. The second semiconductor layer SCL2 is disposed on the active layer AL, and may include a semiconductor layer of a type different from that of the first semiconductor layer SCL1. For example, the second semiconductor layer SCL2 may include an n-type semiconductor layer. For example, the second semiconductor layer SCL2 may include a semiconductor material selected from among InAlGaN, GaN, AlGaN, InGaN, AlN, and InN, and may include an n-type semiconductor layer doped with a second conductive dopant such as Si, Ge, Sn, or the like. However, the material for forming the second semiconductor layer SCL2 is not limited thereto, and the second semiconductor layer SCL2 may be made of various materials.

When a voltage of a threshold voltage or more is applied to respective ends of the light emitting element LD, the light emitting element LD may emit light while electron-hole pairs are combined in the active layer AL. By controlling the light emitting of the light emitting element LD by using this principle, the light emitting element LD may be used as a light source for various light emitting devices in addition to pixels of a display device.

Referring to FIG. 3, in one or more embodiments, the light emitting element LD may further include an electron blocking layer EBL, a strain relief buffer layer SRL, and an element insulating film INF.

According to one or more embodiments, the electron blocking layer EBL may be disposed between the first semiconductor layer SCL1 and the active layer AL. The electron blocking layer EBL may restrict movement of electrons in order to prevent a decrease in luminous efficiency in the active layer AL due to abnormal movement of electrons.

According to one or more embodiments, the strain relief buffer layer SRL may be disposed between the active layer AL and the second semiconductor layer SCL2. In one or more embodiments, the strain relief layer SRL may have a superlattice structure, and may substantially relieve (or reduce) strain that may be generated in the light emitting elements LD (for example, the entire second semiconductor layer SCL2).

According to one or more embodiments, the element insulating film INF may be disposed on an outer surface (e.g., an outer peripheral or circumferential surface) of the light emitting element LD. The element insulating film INF may be formed on the surface of the light emitting element LD so as to be around (e.g., to surround) at least an outer surface (e.g., an outer peripheral or circumferential surface) of the active layer AL, and may further be around (e.g., surround) one area of the first and second semiconductor layers SCL1 and SCL2. The element insulating film INF may be formed as a single film or a double film, but is not limited thereto, and may be formed as a plurality of films. The element insulating film INF may expose respective ends of the light emitting element LD having different polarities. For example, the element insulating film INF may expose one end of each of the first semiconductor layer SCL1 and the second semiconductor layer SCL2 adjacent to the first and second ends EP1 and EP2 of the light emitting element LD.

The element insulating film INF may include one insulating material selected from among a silicon oxide (SiOx), a silicon nitride (SiNx), a silicon oxynitride (SiOxNy), an aluminum oxide (AlOx), and a titanium oxide (TiOx). However, the present disclosure is not necessarily limited to the example described above. In one or more embodiments, the disposition of the element insulating film INF may be omitted.

The structure and shape of the light emitting element LD are not limited to the above-described example, and in one or more embodiments, the light emitting element LD may have various structures and shapes, and may further include an additional constituent element. For example, the light emitting elements LD may include a contact electrode layer (for example, an ohmic contact electrode or a Schottky contact electrode) adjacent to the first semiconductor layer SCL1 and/or the second semiconductor layer SCL2.

Hereinafter, a light emitting element LD according to one or more embodiments will be described with reference to FIG. 4 to FIG. 6. The light emitting elements LD according to one or more embodiments will be described with a focus on differences compared with the light emitting element LD according to one or more embodiments described above. Descriptions that may be redundant to those described above are simplified or are not repeated.

FIG. 4 illustrates a schematic perspective view of a light emitting element LD according to one or more embodiments. FIG. 5 illustrates a schematic top plan view of a light emitting element LD according to one or more embodiments. FIG. 6 illustrates a schematic top plan view of a light emitting element LD including a partially modified structure according to one or more embodiments.

Referring to FIG. 4 to FIG. 6, the light emitting element LD according to one or more embodiments may have an inclined side surface. The light emitting element LD may have a side inclined line that becomes narrower in one direction. For example, a cut surface of the light emitting element LD in one direction (for example, a direction from the first end EP1 to the second end EP2) may have a trapezoidal shape.

According to one or more embodiments, an area of the first surface S1 of the light emitting element LD may be larger than that of the second surface S2 of the light emitting element LD. In this case, a cross-sectional area in a lower direction of the first semiconductor layer SCL1 may decrease from the first end EP1 to the second end EP2. A cross-sectional area in a lower direction of the second semiconductor layer SCL2 may decrease from the first end EP1 to the second end EP2. In one or more embodiments, when an etching process for manufacturing the light emitting element LD is performed, process parameters may be controlled, and accordingly, the light emitting element LD having an inclined side surface may be manufactured.

Hereinafter, for better understanding and ease of description, the light emitting element LD according to one or more embodiments having an inclined side surface will be described as a reference.

Figure 7:
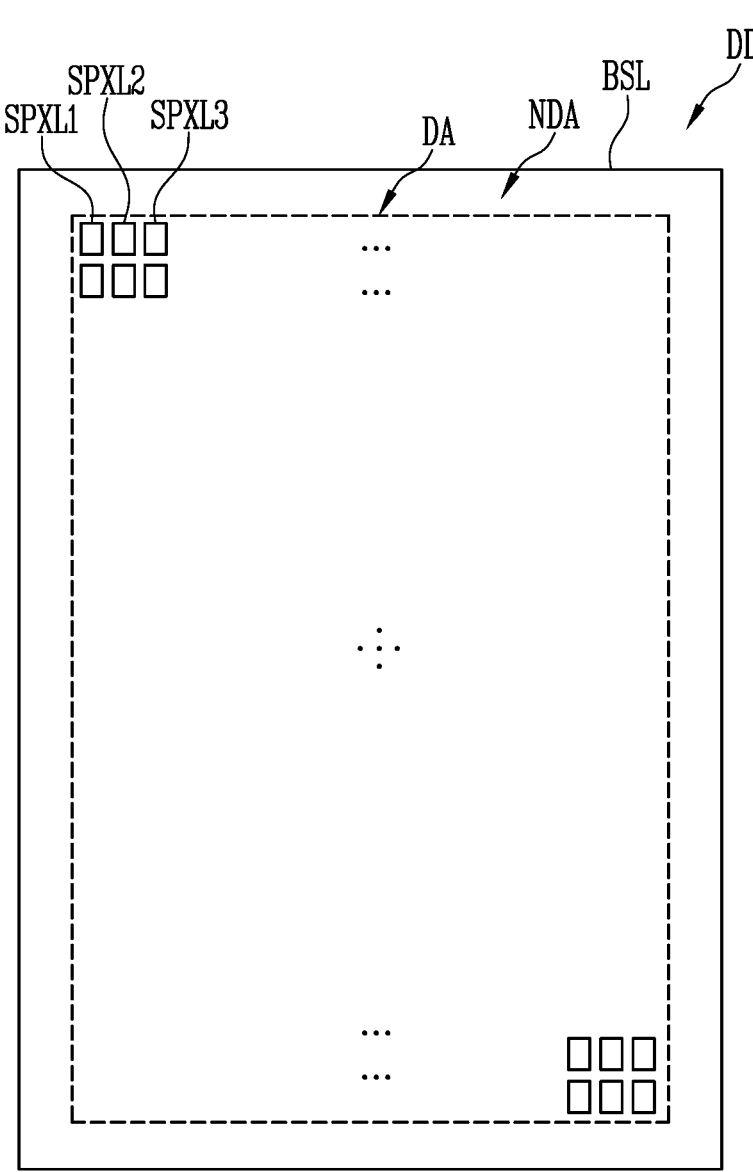
FIG. 7 illustrates a schematic top plan view of a display device according to one or more embodiments.
Figure 7:
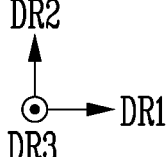

FIG. 7 illustrates a schematic top plan view of a display device according to one or more embodiments.

Referring to FIG. 7, a display device DD may include a base layer BSL, and a pixel PXL (or sub-pixels SPXL) disposed on the base layer BSL. In one or more embodiments, the display device DD may further include a driving circuit part (for example, a scan driver and a data driver) for driving the pixel PXL, wires, and pads.

The display device DD may include a display area DA and a non-display area NDA along an edge or periphery of the display area DA. The non-display area NDA may refer to an area other than the display area DA. The non-display area NDA may be around at least a portion of the display area DA.

The base layer BSL may form a base member of the display device DD. The base layer BSL may be a rigid or flexible substrate or film. For example, the base layer BSL may be a hard substrate made of glass or tempered glass, a flexible substrate (or a thin film) made of a plastic or metallic material, or at least one layered insulating layer. The material and/or physical properties of the base layer BSL are not particularly limited. In one or more embodiments, the base layer BSL may be substantially transparent. Here, the "substantially transparent" may mean that light may be transmitted at a desired transmittance (e.g., a predetermined transmittance) or more. In one or more embodiments, the base layer BSL may be translucent or opaque. In addition, the base layer BSL may include a reflective material according to one or more embodiments.

The display area DA may refer to an area in which the pixel PXL is disposed. The non-display area NDA may refer to an area in which the pixel PXL is not disposed. In the non-display area NDA, the driving circuit part, wires, and pads connected to the pixel PXL of the display area DA may be disposed.

According to one or more embodiments, the pixels PXL may be arranged according to a stripe or a PENTILE® structure, or the like. The PENTILE® pixel arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. However, the arrangement structure of the pixels PXL is not limited thereto, and the pixels PXL may be arranged in the display area DA by using various structures and/or methods.

According to one or more embodiments, the pixel PXL (or the sub-pixels SPXL) may include a first sub-pixel SPXL1, a second sub-pixel SPXL2, and a third sub-pixel SPXL3. Each of the first sub-pixel SPXL1, the second sub-pixel SPXL2, and the third sub-pixel SPXL3 may be a sub-pixel. At least one of the first sub-pixel SPXL1, the second sub-pixel SPXL2, or the third sub-pixel SPXL3 may form one pixel unit capable of emitting light of various colors.

For example, each of the first sub-pixel SPXL1, the second sub-pixel SPXL2, and the third sub-pixel SPXL3 may emit light of a desired color (e.g., a predetermined color). For example, the first sub-pixel SPXL1 may be a red pixel emitting red (for example, a first color) light, and the second sub-pixel SPXL2 may be a green pixel emitting green (for example, a second color) light, and the third sub-pixel SPXL3 may be a blue pixel emitting blue (for example, a third color) light. In one or more embodiments, the number of the second sub-pixels SPXL2 may be greater than the number of the first sub-pixels SPXL1 and the number of the third sub-pixels SPXL3. However, the color, type, and/or number of the first sub-pixel SPXL1, the second sub-pixel SPXL2, and the third sub-pixel SPXL3 configuring each pixel unit described above are not limited to a specific example.

Hereinafter, a pixel PXL according to one or more embodiments will be described with reference to FIG. 8 to FIG. 25. Descriptions that may be redundant to those described above are omitted or are not repeated.

Figure 8:
FIG. 8 illustrates a schematic top plan view of a pixel according to one or more embodiments.

First, a planar structure of the pixel PXL will be described with reference to FIG. 8. FIG. 8 illustrates a schematic top plan view of a pixel according to one or more embodiments. In one or more embodiments, the structure of the pixel PXL shown in FIG. 8 may correspond to one of the sub-pixels SPXL. The active layer AL is represented by hatching so that the direction in which the light emitting elements LD are aligned may be clearly understood. In one or more embodiments, a relatively thinly shown layer disposed at one side of the active layer AL may be the first semiconductor layer SCL1, and a relatively thickly shown layer disposed at the other side of the active layer AL may be the second semiconductor layer SCL2.

The pixel PXL may include a light emitting area EMA and a non-light emitting area NEA. The pixel PXL may include a bank BNK, electrodes ALE, light emitting elements LD, and connection electrodes ELT.

The light emitting area EMA may overlap an opening OPN defined by the bank BNK in a plan view. The light emitting elements LD may be disposed in the light emitting area EMA.

The light emitting elements LD may not be disposed in the non-light emitting area NEA. A portion of the non-light emitting area NEA may overlap the bank BNK in a plan view.

The bank BNK may form (or provide) the opening OPN. For example, the bank BNK may have a shape protruding in a thickness direction (for example, a third direction DR3) of the base layer BSL, and may have a shape surrounding a suitable area (e.g., a predetermined area). Accordingly, the opening OPN in which the bank BNK is not disposed may be formed.

The bank BNK may form a space. The bank BNK may have a shape surrounding a partial area in a plan view. The space may refer to an area in which a fluid may be accommodated. According to one or more embodiments, the bank BNK may include a first bank (see 'BNK1' in FIG. 9) and a second bank (see 'BNK2' in FIG. 9).

According to one or more embodiments, ink including the light emitting element LD is provided in a space defined by the bank BNK (for example, the first bank BNK1), so that the light emitting element LD may be disposed in the opening OPN.

According to one or more embodiments, a color converting layer (see 'CCL' in FIG. 10) may be disposed (or patterned) in a space defined by the bank BNK (for example, the second bank BNK2).

The bank BNK may define the light emitting area EMA and the non-light emitting area NEA. The bank BNK may surround at least a portion of the light emitting area EMA in a plan view. For example, an area in which the bank BNK is disposed may be the non-light emitting area NEA. As an area in which the bank BNK is not disposed, an area in which the light emitting element LD is disposed may be the light emitting area EMA.

The electrodes ALE may be electrodes for aligning the light emitting elements LD. In one or more embodiments, the electrodes ALE may include a first electrode ALE1 and a second electrode ALE2.

The electrodes ALE may have a single-layered or multi-layered structure. For example, the electrodes ALE may include at least one reflective electrode layer including a reflective conductive material, and may optionally further include at least one transparent electrode layer and/or a conductive capping layer. In one or more embodiments, the electrode ALE may include one selected from among silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the present disclosure is not limited to the above example, and the electrodes ALE may include one of various materials having a reflective characteristic. However, the present disclosure is not limited to the example described above.

The light emitting element LD may be disposed on the electrodes ALE. In one or more embodiments, at least a portion of the light emitting element LD may be disposed between the first electrode ALE1 and the second electrode ALE2. The light emitting element LD may be aligned between the first electrode ALE1 and the second electrode ALE2. The light emitting elements LD may form (or configure) a light emitting unit EMU. The light emitting unit EMU may refer to a unit including light emitting elements LD adjacent to each other.

In one or more embodiments, the light emitting element LD may be arranged in various ways. For example, FIG. 8 illustrates the embodiment in which the light emitting elements LD are arranged in parallel between the first electrode ALE1 and the second electrode ALE2. However, the present disclosure is not necessarily limited to the example described above. For example, the light emitting elements LD may be arranged in a series structure or a mixed series/parallel structure, and the number of units connected in series and/or parallel is not particularly limited.

The first electrode ALE1 and the second electrode ALE2 may be spaced from each other. For example, the first electrode ALE1 and the second electrode ALE2 may be spaced from each other along a first direction DR1 in the light emitting area EMA, and may respectively extend along a second direction DR2.

According to one or more embodiments, the first electrode ALE1 and the second electrode ALE2 are electrodes for aligning the light emitting element LD, and the first electrode ALE1 may be a first alignment electrode, and the second electrode ALE2 may be a second alignment electrode. The first electrode ALE1 and the second electrode ALE2 may be supplied (or provided) with a first alignment signal and a second alignment signal, respectively, in a process step in which the light emitting elements LD are aligned. For example, ink including the light emitting element LD may be supplied (or provided) to the opening OPN defined by the bank BNK (for example, the first bank BNK1), and the first alignment signal may be supplied to the first electrode ALE1, and the second alignment signal may be supplied to the second electrode ALE2. In this case, the first alignment signal and the second alignment signal may have different waveforms, potentials, and/or phases. For example, the first alignment signal may be an AC signal, and the second alignment signal may be a ground signal. However, the present disclosure is not necessarily limited to the example described above. An electric field is formed between (or on) the first electrode ALE1 and the second electrode ALE2, so that the light emitting elements LD may be aligned between the first electrode ALE1 and the second electrode ALE2 based on the electric field. For example, the light emitting elements LD may be moved (or rotated) by force (for example, a dielectrophoresis (DEP) force) according to the electric field to be aligned (or disposed) on the electrodes ALE.

The first electrode ALE1 may be electrically connected to a circuit element (for example, a transistor (see 'TR' in FIG. 9)) through a first contact member CNT1. In one or more embodiments, the first electrode ALE1 may provide an anode signal for the light emitting element LD to emit light. The first electrode ALE1 may provide the first alignment signal for aligning the light emitting element LD.

The second electrode ALE2 may be electrically connected to a power wire (see 'PL' in FIG. 9) through a second contact member CNT2. In one or more embodiments, the second electrode ALE2 may provide a cathode signal for the light emitting element LD to emit light. The second electrode ALE2 may provide the second alignment signal for aligning the light emitting element LD.

The positions of the first contact member CNT1 and the second contact member CNT2 are not limited to the positions shown in FIG. 8, and may be appropriately and variously changed.

The light emitting element LD may emit light based on an electrical signal provided from the connecting electrode ELT. The connecting electrode ELT may be disposed on the first end EP1 and the second end EP2 of the light emitting element LD to be electrically connected to the light emitting element LD. For example, the light emitting element LD may provide light based on a first electrical signal (for example, an anode signal) provided from a first connecting electrode ELT1 that is an anode connecting electrode ELTA and a second electrical signal (for example, a cathode signal) provided from a second connecting electrode ELT2 that is a cathode connecting electrode ELTC.

The first end EP1 of the light emitting element LD having a relatively large base area may face the first connecting electrode ELT1, and the second end EP2 of the light emitting element LD having a relatively small base area may face the second connecting electrode ELT2.

The first end EP1 of the light emitting element LD may be disposed to be adjacent to the first electrode ALE1 and the first connecting electrode ELT1, and the second end EP2 of the light emitting element LD may be disposed to be adjacent to the second electrode ALE2 and the second connecting electrode ELT2. The first end EP1 may or may not overlap the first electrode ALE1. The second end EP2 may or may not overlap the second electrode ALE2.

The first end EP1 of the light emitting element LD may be directed to the anode connecting electrode ELTA. The first end EP1 of the light emitting element LD may be electrically connected to the first connecting electrode ELT1. For example, the first connecting electrode ELT1 may include a first base portion B1 and a first protruding portion P1 connected to (or integrally formed with) the first base portion B1. The first end EP1 of the light emitting element LD may be electrically connected to the first protruding portion P1. For example, the first end EP1 of the light emitting element LD may be electrically connected to the first protruding portion P1 without being physically connected to the first base portion B1.

The second end EP2 of the light emitting element LD may be directed to the cathode connecting electrode ELTC. The second end EP2 of the light emitting element LD may be electrically connected to the second connecting electrode ELT2. For example, the second connecting electrode ELT2 may include a second base portion B2 and a second protruding portion P2 connected to (or integrally formed with) the second base portion B2. The second end EP2 of the light emitting element LD may be electrically connected to the second protruding portion P2. For example, the second end EP2 of the light emitting element LD may be electrically connected to the second protruding portion P2 without being physically connected to the second base portion B2.

According to one or more embodiments, the light emitting elements LD may be disposed between the first protruding portion P1 and the second protruding portion P2 in a plan view. For example, the aligned positions of the light emitting elements LD may be determined based on positions of the protruding patterns IP (see FIG. 14) disposed on the base layer BSL, and accordingly, the light emitting elements LD may be electrically connected between the first protruding portion P1 and the second protruding portion P2. This will be described in detail later.

Figure 10:
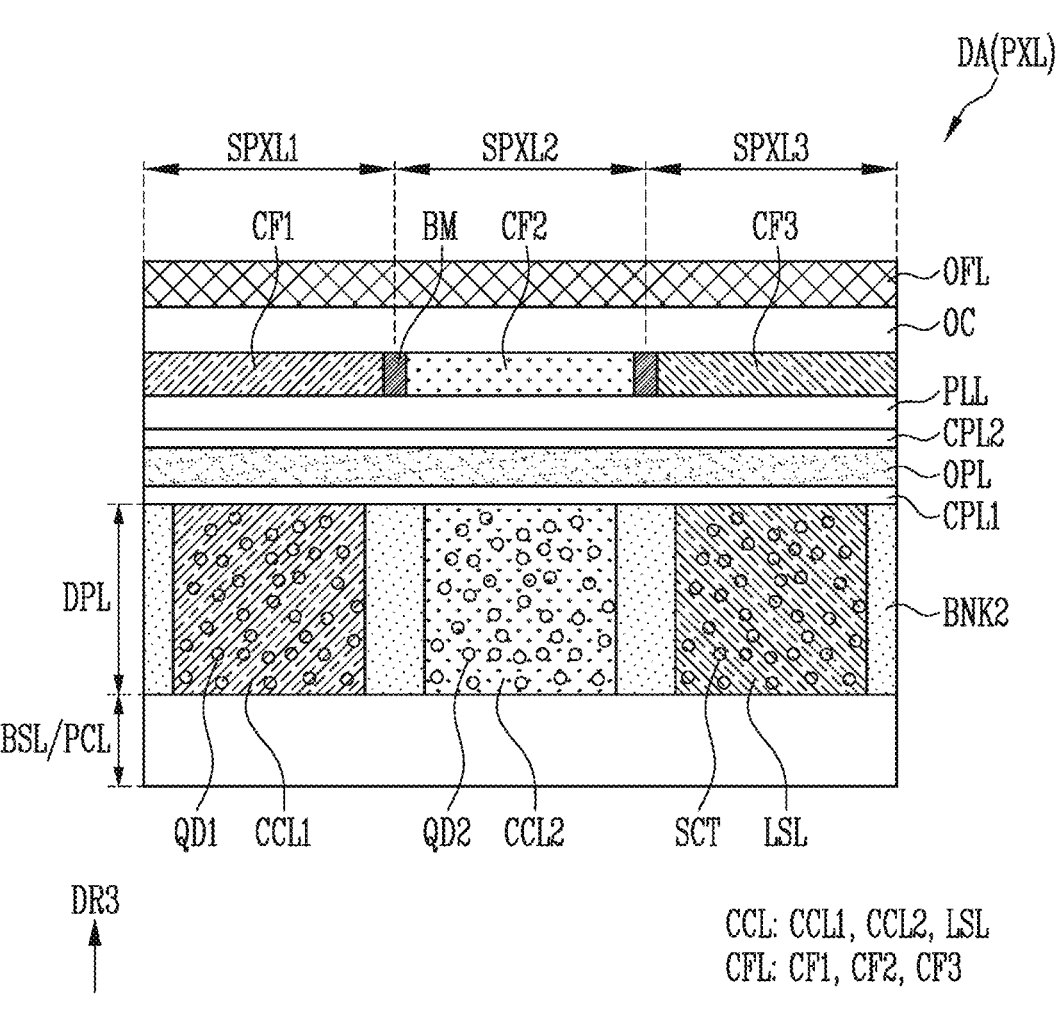
FIG. 10 illustrates a schematic cross-sectional view of a pixel according to one or more embodiments.
Figure 11:
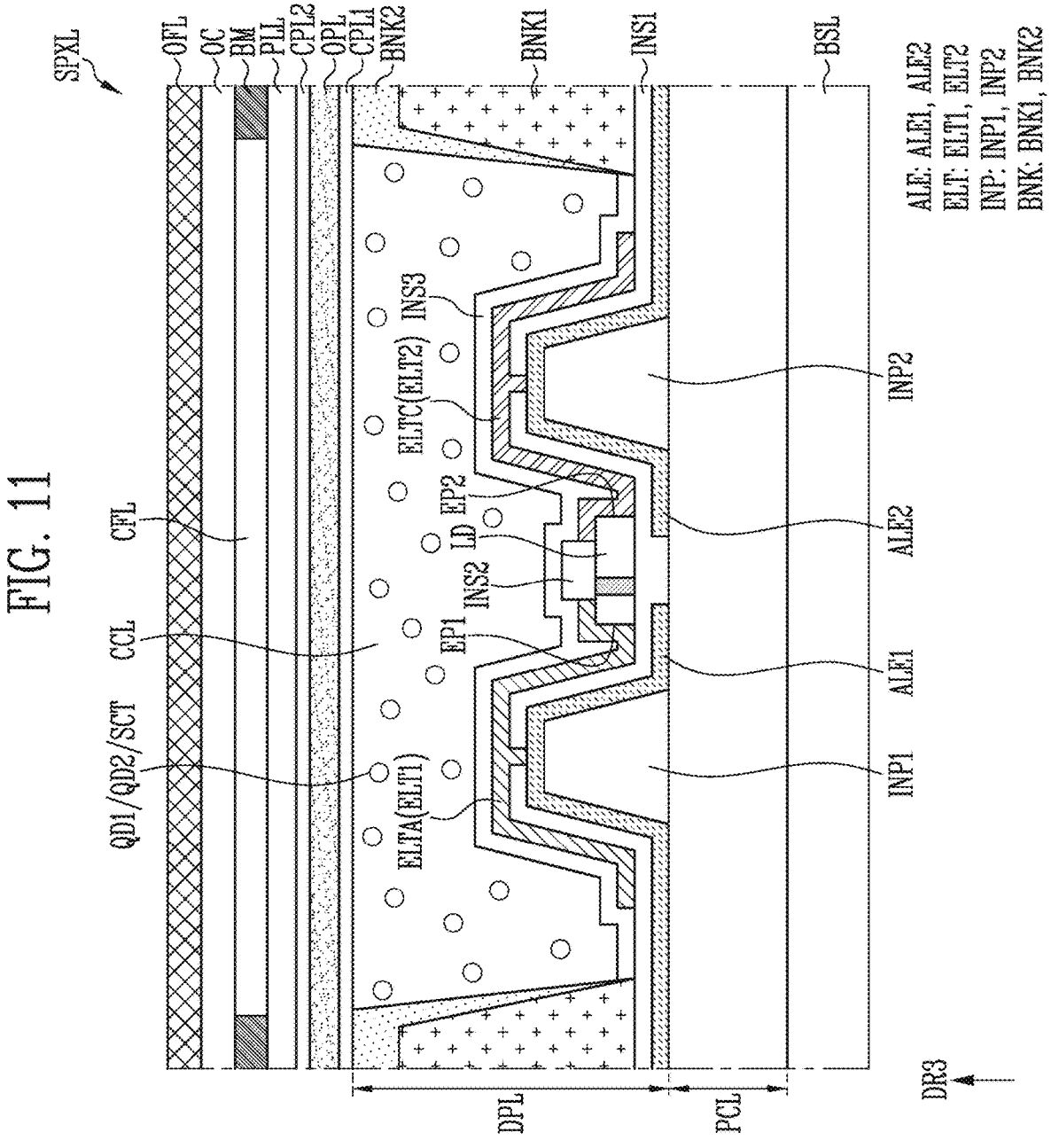
FIG. 11 illustrates a schematic cross-sectional view of a sub-pixel according to one or more embodiments.

Hereinafter, a cross-sectional structure of the pixel PXL (or the sub-pixel SPXL) according to one or more embodiments will be described with reference to FIG. 9 to FIG. 11. A pixel circuit layer PCL and a display element layer DPL of the sub-pixel SPXL will be described with reference to FIG. 9. An optical layer OPL, a color filter layer CFL, and an outer film layer OFL will be described with reference to FIG. 10 and FIG. 11. Contents that may be redundant to the above-described contents are to be simplified or not to be duplicated. In addition, although the light emitting element LD according to one or more embodiments has an asymmetric structure, the shape of the light emitting element LD is schematically illustrated in FIG. 9 to FIG. 11 for better understanding and ease of description.

Figure 9:
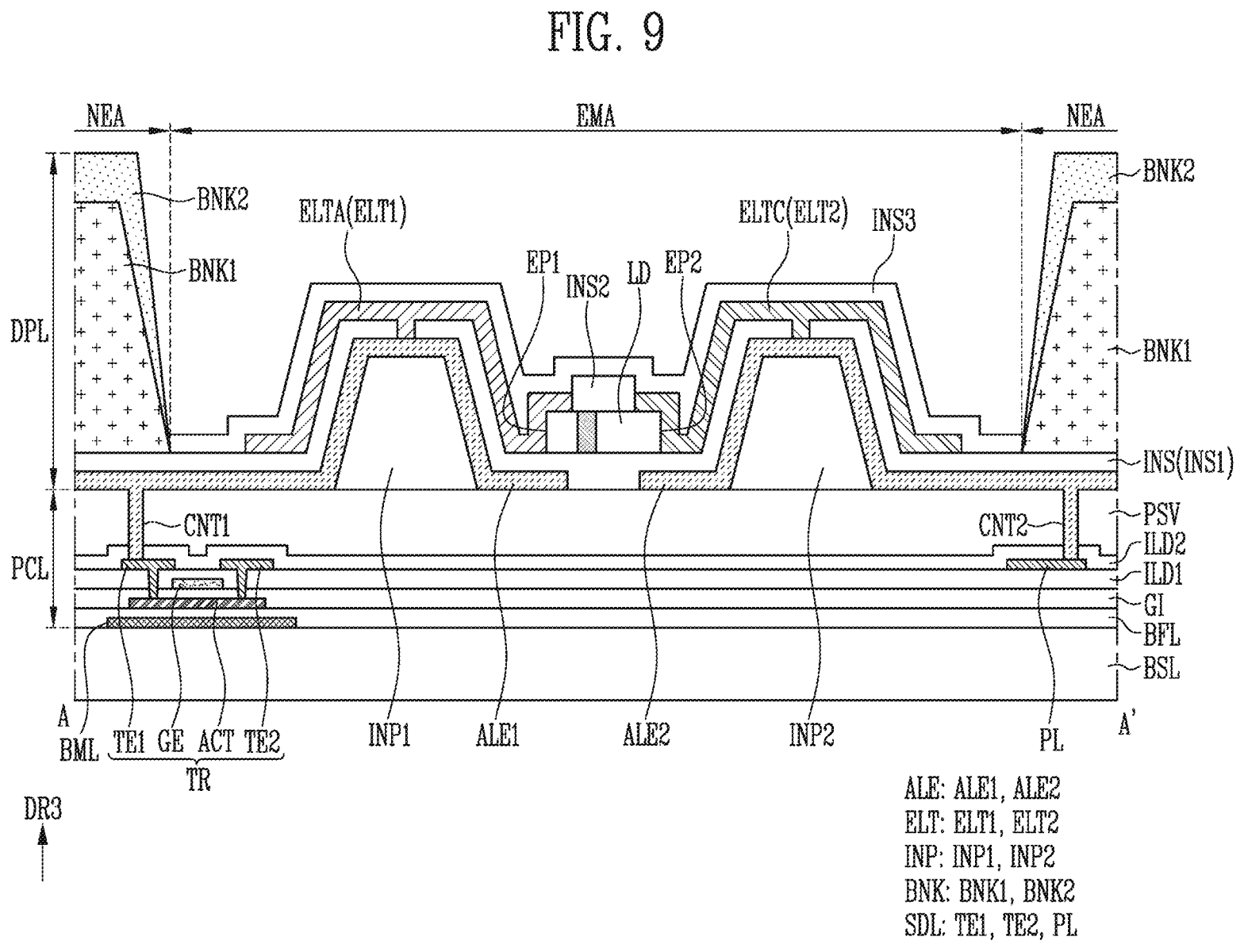

FIG. 9 illustrates a schematic cross-sectional view of a pixel PXL (or a sub-pixel SPXL) according to one or more embodiments. FIG. 9 illustrates a cross-sectional view taken along the line A-A' of FIG. 8. FIG. 10 illustrates a schematic cross-sectional view of a pixel according to one or more embodiments. FIG. 11 illustrates a schematic cross-sectional view of a sub-pixel according to one or more embodiments.

Referring to FIG. 9, the sub-pixel SPXL may be disposed on the base layer BSL. The sub-pixel SPXL may include the pixel circuit layer PCL and the display element layer DPL.

The base layer BSL may form a base member for forming the sub-pixel SPXL. The base layer BSL may provide an area for disposing the pixel circuit layer PCL and the display element layer DPL.

The pixel circuit layer PCL may be disposed on the base layer BSL. The pixel circuit layer PCL may include a bottom auxiliary electrode BML, a buffer film BFL, a transistor TR, a gate insulating film GI, a first interlayer insulating film ILD1, a second interlayer insulating film ILD2, and a passivation film PSV.

The bottom auxiliary electrode BML may be disposed on the base layer BSL. The bottom auxiliary electrode BML may function as a path through which an electrical signal is transmitted. In one or more embodiments, a portion of the bottom auxiliary electrode BML may overlap the transistor TR in a plan view.

The buffer film BFL may be disposed on the base layer BSL. The buffer film BFL may cover the bottom auxiliary electrode BML. The buffer film BFL may prevent impurities from being diffused from the outside. The buffer film BFL may include one selected from among a silicon oxide (SiOx), a silicon nitride (SiNx), a silicon oxynitride (SiOxNy), an aluminum oxide (AlOx), and a titanium oxide (TiOx). However, the present disclosure is not limited to the example described above.

The transistor TR may be a thin film transistor (TFT). According to one or more embodiments, the transistor TR may be a driving transistor. The transistor TR may be electrically connected to the light emitting element LD. The transistor TR may be electrically connected to the first end EP1 of the light emitting element LD.

The transistor TR may include the active layer ACT, the first transistor electrode TE1, the second transistor electrode TE2, and the gate electrode GE.

The active layer ACT may be a semiconductor layer. The active layer ACT may be disposed on the buffer film BFL. The active layer ACT may include one selected from among a polysilicon, a low temperature polycrystalline silicon (LTPS), an amorphous silicon, and an oxide semiconductor.

The active layer ACT may be on the buffer film BFL and may include a first contact area contacting the first transistor electrode TE1 and a second contact area contacting the second transistor electrode TE2. The first contact area and the second contact area may be a semiconductor pattern doped with an impurity. An area between the first contact area and the second contact area may be a channel area. The channel area may be an intrinsic semiconductor pattern in which no impurity is doped.

A gate insulating film GI may be disposed on the active layer ACT and the buffer film BFL. The gate electrode GE may be disposed on the gate insulating film GI. The position of the gate electrode GE may correspond to the position of the channel area of the active layer ACT. For example, the gate electrode GE may be disposed on the channel area of the active layer ACT with the gate insulating film GI interposed therebetween.

The gate insulating film GI may be disposed on the buffer film BFL. The gate insulating film GI may cover the active layer ACT. The gate insulating film GI may include one selected from among a silicon oxide (SiOx), a silicon nitride (SiNx), a silicon oxynitride (SiOxNy), an aluminum oxide (AlOx), and a titanium oxide (TiOx). However, the present disclosure is not limited to the example described above.

The first interlayer insulating film ILD1 may be disposed on the gate insulating film GI and the gate electrode GE. The first interlayer insulating film ILD1 may cover the gate electrode GE. The first interlayer insulating film ILD1 may include one selected from among a silicon oxide (SiOx), a silicon nitride (SiNx), a silicon oxynitride (SiOxNy), an aluminum oxide (AlOx), and a titanium oxide (TiOx). However, the present disclosure is not limited to the example described above.

The first transistor electrode TE1 and the second transistor electrode TE2 may be disposed on the first interlayer insulating film ILD1. The first transistor electrode TE1 may pass through the gate insulating film GI and the first interlayer insulating film ILD1 to contact the first contact area of the active layer ACT, and the second transistor electrode TE2 may pass through the gate insulating film GI and the first interlayer insulating film ILD1 to contact the second contact area of the active layer ACT. For example, the first transistor electrode TE1 may be a drain electrode, and the second transistor electrode TE2 may be a source electrode, but are not limited thereto.

The first transistor electrode TE1 may be electrically connected to the first electrode ALE1 through the first contact member CNT1 passing through the passivation film PSV and the second interlayer insulating film ILD2.

The power wire PL may be disposed on the first interlayer insulating film ILD1. In one or more embodiments, the power wire PL may be disposed on a same layer as the first transistor electrode TE1 and the second transistor electrode TE2. The power wire PL may be electrically connected to the second electrode ALE2 through the second contact member CNT2. The power wire PL may supply a power voltage or an alignment signal through the second electrode ALE2.

According to one or more embodiments, the layer in which the first transistor electrode TE1, the second transistor electrode TE2, and the power wire PL are disposed may be a source/drain layer SDL. The source/drain layer SDL may include a plurality of layers disposed on a same layer. For example, the source/drain layer SDL may include the first transistor electrode TE1, the second transistor electrode TE2, and the power wire PL.

The second interlayer insulating film ILD2 may be disposed on the first interlayer insulating film ILD1, the first transistor electrode TE1, the second transistor electrode TE2, and the power wire PL. The second interlayer insulating film ILD2 may cover the first transistor electrode TE1, the second transistor electrode TE2, and the power wire PL. The second interlayer insulating film ILD2 may include one selected from among a silicon oxide (SiOx), a silicon nitride (SiNx), a silicon oxynitride (SiOxNy), an aluminum oxide (AlOx), and a titanium oxide (TiOx). However, the present disclosure is not limited to the example described above.

The passivation film PSV may be disposed on the second interlayer insulating film ILD2. In one or more embodiments, the passivation film PSV may be a via layer. The passivation film PSV may include an organic material to flatten a lower step. For example, the passivation film PSV may include an organic material such as an acrylates resin, an epoxy resin, a phenolic resin, a polyamides resin, a polyimide resin, a polyesters resin, a polyphenylenesulfides resin, or a benzocyclobutene (BCB). However, it is not necessarily limited thereto, and the passivation film PSV may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and/or various types of inorganic materials.

According to one or more embodiment, the sub-pixel SPXL may include the first contact member CNT1 and the second contact member CNT2. The first contact member CNT1 and the second contact member CNT2 may pass through the second interlayer insulating film ILD2 and the passivation film PSV. The first electrode ALE1 and the first transistor electrode TE1 may be electrically connected to each other through the first contact member CNT1. The second electrode ALE2 and the power wire PL may be electrically connected to each other through the second contact member CNT2.

The display element layer DPL may be disposed on the pixel circuit layer PCL. The display element layer DPL may include an insulating layer INS, an insulating pattern INP, electrodes ALE, a bank BNK, a light emitting element LD, a second insulating film INS2, a first connecting electrode ELT1, a second connecting electrode ELT2, and a third insulating film INS3.

The insulating pattern INP may be disposed on the passivation film PSV. The insulating pattern INP may have various shapes according to one or more embodiments. In one or more embodiments, the insulating pattern INP may protrude in a thickness direction (for example, a third direction DR3) of the base layer BSL. In addition, the insulating pattern INP may be formed to have an inclined surface inclined at a suitable angle (e.g., a predetermined angle) with respect to the base layer BSL. However, the present disclosure is not necessarily limited thereto, and the insulating pattern INP may have a side wall such as a curved surface or a step shape. For example, the insulating pattern INP may have a cross-section of a semicircle or semi-ellipse shape.

The insulating pattern INP may serve to form a suitable step (e.g., a predetermined step) so that the light emitting elements LD may be easily aligned in the light emitting area EMA. In one or more embodiments, the insulating pattern INP may be a partition wall.

According to one or more embodiments, some of the electrodes ALE may be disposed on the insulating pattern INP. For example, the insulating pattern INP may include a first insulating pattern INP1 and a second insulating pattern INP2. The first electrode ALE1 may be disposed on the first insulating pattern INP1, and the second electrode ALE2 may be disposed on the second insulating pattern INP2, and accordingly, a reflective wall may be formed on the insulating pattern INP. Accordingly, light emitted from the light emitting element LD is recycled, so that the light output efficiency of the display device DD (or the pixel PXL) may be improved.

The insulating pattern INP may include at least one organic material and/or inorganic material. For example, the insulating pattern INP may include an organic material such as an acrylates resin, an epoxy resin, a phenolic resin, a polyamides resin, a polyimide resin, a polyesters resin, a polyphenylenesulfides resin, or a benzocyclobutene (BCB). However, it is not necessarily limited thereto, and the insulating pattern INP may be configured as a single layer or a multilayer, and may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and/or various types of inorganic materials.

The electrodes ALE may be disposed on the passivation film PSV and/or the insulating pattern INP. As described above, some of the electrodes ALE may be disposed on the insulating pattern INP to form a reflective wall. An alignment signal (for example, an AC signal and a ground signal) for aligning the light emitting element LD may be supplied to the electrodes ALE, and in one or more embodiments, an electrical signal (for example, an anode signal and a cathode signal) for the light emitting element LD to emit light may be supplied to the electrodes ALE.

According to one or more embodiments, the electrodes ALE may be disposed on a rear surface of the insulating layer INS (or the first insulating layer INS1). For example, the electrodes ALE may be disposed between the insulating pattern INP or the passivation film PSV and the first insulating film INS1. For example, one surface of the electrodes ALE may contact the first insulating film INS1.

The first electrode ALE1 may be electrically connected to the light emitting element LD. The first electrode ALE1 may be electrically connected to the first connecting electrode ELT1 through a contact hole formed in the first insulating film INS1. The first electrode ALE1 may provide an anode signal for the light emitting element LD to emit light.

The second electrode ALE2 may be electrically connected to the light emitting element LD. The second electrode ALE2 may be electrically connected to the second connecting electrode ELT2 through the contact hole formed in the first insulating film INS1. The second electrode ALE2 may provide a cathode signal (for example, a ground signal) for the light emitting element LD to emit light.

The insulating layer INS may include the first insulating film INS1. The insulating layer INS may include the first insulating film INS1, a first protruding pattern IP1 (see FIG. 14), and a second protruding pattern IP2 (see FIG. 14). In one or more embodiments, the first insulating film INS1 may be formed in a same process as the first and second protruding patterns IP1 and IP2. Alternatively, in one or more embodiments, the first insulating film INS1 may be formed in a process different from the first and second protruding patterns IP1 and IP2. The first and second protruding patterns IP1 and IP2 will be described in detail later with reference to FIG. 14 and drawings following FIG. 14.

The insulating layer INS may be disposed on the electrodes ALE. For example, the first insulating film INS1 may cover the first electrode ALE1 and the second electrode ALE2.

The bank BNK may be disposed on the insulating layer INS (or the first insulating film INS1). In one or more embodiments, the bank BNK may include a first bank BNK1 and a second bank BNK2.

The first bank BNK1 may be disposed on the insulating layer INS (or the first insulating film INS1). In one or more embodiments, the first bank BNK1 may not overlap the light emitting area EMA and may overlap the non-light emitting area NEA in a plan view. As described above, the first bank BNK1 may protrude in the thickness direction (for example, the third direction DR3) of the base layer BSL to define the opening OPN, and in the process of supplying the light emitting elements LD, a space in which the light emitting elements LD may be provided may be formed in the opening OPN.

The first bank BNK1 may include an organic material such as an acrylates resin, an epoxy resin, a phenolic resin, a polyamides resin, a polyimide resin, a polyesters resin, a polyphenylenesulfides resin, or a benzocyclobutene (BCB). However, it is not necessarily limited thereto, and the first bank BNK1 may be configured as a single layer or a multilayer, and may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and/or various types of inorganic materials.

The second bank BNK2 may be disposed on the first bank BNK1. The second bank BNK2 may protrude in the thickness direction (for example, the third direction DR3) of the base layer BSL to define the opening OPN, and a space in which the color converting layer CCL is provided may be formed in the opening OPN.

The second bank BNK2 may include an organic material such as an acrylates resin, an epoxy resin, a phenolic resin, a polyamides resin, a polyimide resin, a polyesters resin, a polyphenylenesulfides resin, or a benzocyclobutene (BCB). However, it is not necessarily limited thereto, and the second bank BNK2 may be configured as a single layer or a multilayer, and may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and/or various types of inorganic materials.

The light emitting element LD may be disposed on the insulating layer INS (or the first insulating film INS1). In one or more embodiments, the light emitting element LD may emit light based on an electrical signal (for example, an anode signal and a cathode signal) provided from the first connecting electrode ELT1 and the second connecting electrode ELT2.

The light emitting element LD may be disposed in an area surrounded by the first bank BNK1. The light emitting element LD may be disposed between the first insulating pattern INP1 and the second insulating pattern INP2.

The second insulating film INS2 may be disposed on the light emitting element LD. The second insulating film INS2 may cover the active layer AL of the light emitting element LD.

The second insulating film INS2 may expose at least a portion of the light emitting element LD. For example, the second insulating film INS2 may not cover the first end EP1 and the second end EP2 of the light emitting element LD, and accordingly, the first end EP1 and the second end EP2 of the light emitting element LD may be exposed and may be electrically connected to the first connecting electrode ELT1 and the second connecting electrode ELT2, respectively.

When the second insulating film INS2 is formed on the light emitting elements LD after the alignment of the light emitting elements LD is completed, it is possible to prevent the light emitting elements LD from deviating from an aligned position.

The second insulating film INS2 may have a single-layered or multi-layered structure. For example, the second insulating film INS2 may be configured as a single layer or a multilayer, and may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and/or various types of inorganic materials. However, the present disclosure is not limited to the example described above.

The first connecting electrode ELT1 and the second connecting electrode ELT2 may be disposed on the insulating layer INS (or the first insulating film INS1). The first connecting electrode ELT1 may be electrically connected to the first end EP1 of the light emitting element LD. The second connecting electrode ELT2 may be electrically connected to the second end EP2 of the light emitting element LD.

The first connecting electrode ELT1 may be electrically connected to the first electrode ALE1 through a contact hole passing through the insulating layer INS (or the first insulating film INS1), and the second connecting electrode ELT2 may be electrically connected to the second electrode ALE2 through a contact hole passing through the first insulating film INS1.

The first connecting electrode ELT1 and the second connecting electrode ELT2 may include a conductive material. For example, the first connecting electrode ELT1 and the second connecting electrode ELT2 may include a transparent conductive material including one selected from among an indium tin oxide (ITO), an indium zinc oxide (IZO), and an indium tin zinc oxide (ITZO). Accordingly, the light emitted from the light emitting elements LD may pass through the connecting electrodes ELT to be emitted to the outside of the display device DD. However, the present disclosure is not necessarily limited to the example described above.

According to one or more embodiments, the first connecting electrode ELT1 and the second connecting electrode ELT2 may be patterned at a same time in a same process. However, the present disclosure is not necessarily limited to the example described above. After one of the first connecting electrode ELT1 and the second connecting electrode ELT2 is patterned, the other thereof may also be patterned.

The third insulating film INS3 may be disposed on the second insulating film INS2 and the connecting electrodes ELT. The third insulating film INS3 may protect components of the display element layer DPL from external influences.

The third insulating film INS3 may have a single-layered or multi-layered structure. For example, a fourth insulating film INS4 may be configured as a single layer or a multi-layer, and may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and/or various types of inorganic materials.

Configurations of the pixel PXL including the color converting layer CCL will be described with reference to FIG. 10 and FIG. 11. FIG. 10 illustrates the color converting layer CCL, the optical layer OPL, and the color filter layer CFL. For better understanding and ease of description, in FIG. 10, among the above-described configurations, configurations that do not include the second bank BNK2 from among the pixel circuit layer PCL and the display element layer DPL are omitted. FIG. 11 illustrates a stacked structure of the pixel PXL in relation to the color converting layer CCL, the optical layer OPL, and the color filter layer CFL.

Referring to FIG. 10 and FIG. 11, the second bank BNK2 is disposed between the first to third sub-pixels SPXL1, SPXL2, and SPXL3 or at a boundary therebetween, and may define a space (or an area) respectively overlapping the first to third sub-pixels SPXL1, SPXL2, and SPXL3. The space defined by the second bank BNK2 may be an area in which the color converting layer CCL may be provided.

The color converting layer CCL may be disposed on the light emitting elements LD in the space surrounded by the second bank BNK2. The color converting layer CCL may include a first color converting layer CCL1 disposed on the first sub-pixel SPXL1, a second color converting layer CCL2 disposed on the second sub-pixel SPXL2, and a scattering layer LSL disposed on the third sub-pixel SPXL3.

The color converting layer CCL may be disposed on the light emitting element LD. The color converting layer CCL may be configured to change a wavelength of light. In one or more embodiments, the first to third sub-pixels SPXL1, SPXL2, and SPXL3 may include the light emitting elements LD that emit light of a same color. For example, the first to third sub-pixels SPXL1, SPXL2, and SPXL3 may include the light emitting elements LD that emit light of a third color (or blue color). The color converting layer CCL including color converting particles is disposed on the first to third sub-pixels SPXL1, SPXL2, and SPXL3, respectively, thereby displaying a full-color image.

The first color converting layer CCL1 may include first color converting particles that convert light of the third color emitted from the light emitting element LD into light of the first color. For example, the first color converting layer CCL1 may include a plurality of first quantum dots QD1 dispersed in a suitable matrix material (e.g., a predetermined matrix material) such as a base resin.

In one or more embodiments, when the light emitting element LD is a blue light emitting element that emits blue light and the first sub-pixel SPXL1 is a red pixel, the first color converting layer CCL1 may include a first quantum dot QD1 that converts blue light emitted from the blue light emitting element into red light. The first quantum dot QD1 may absorb blue light to shift a wavelength according to an energy transition to emit red light. When the first sub-pixel SPXL1 is a pixel of a different color, the first color converting layer CCL1 may include a first quantum dot QD1 corresponding to a color of the first sub-pixel SPXL1.

The second color converting layer CCL2 may include second color converting particles that convert light of the third color emitted from the light emitting element LD into light of the second color. For example, the second color converting layer CCL2 may include a plurality of second quantum dots QD2 dispersed in a suitable matrix material (e.g., a predetermined matrix material) such as a base resin.

In one or more embodiments, when the light emitting element LD is a blue light emitting element that emits blue light and the second sub-pixel SPXL2 is a green pixel, the second color converting layer CCL2 may include a second quantum dot QD2 that converts blue light emitted from the blue light emitting element into green light. The second quantum dot QD2 may absorb blue light to shift a wavelength according to an energy transition to emit green light. When the second sub-pixel SPXL2 is a pixel of a different color, the second color converting layer CCL2 may include a second quantum dot QD2 corresponding to a color of the second sub-pixel SPXL2.

In one or more embodiments, blue light having a relatively short wavelength from among the visible ray bands is incident on the first quantum dot QD1 and the second quantum dot QD2, respectively, thereby increasing an absorption coefficient of the first quantum dot QD1 and the second quantum dot QD2. Accordingly, the efficiency of light emitted from the first sub-pixel SPXL1 and the second sub-pixel SPXL2 may be increased, and at a same time, the excellent color reproducibility may be secured. In addition, the light emitting unit EMU of the first to third sub-pixels SPXL1, SPXL2, and SPXL3 is configured by using the light emitting elements LD of a same color (for example, the blue color light emitting element), thereby increasing the manufacturing efficiency of the display device DD.

The scattering layer LSL may be provided to efficiently use the third color (or blue color) light emitted from the light emitting element LD. For example, when the light emitting element LD is a blue light emitting element that emits blue light and the third sub-pixel SPXL3 is a blue pixel, the scattering layer LSL may include at least one type of scatterer SCT to efficiently use the light emitted from the light emitting element LD. For example, the scatterer SCT of the scattering layer LSL may include at least one of a barium sulfate ($BaSO_4$), a calcium carbonate ($CaCO_3$), a titanium oxide $TiO_2$, a silicon oxide $SiO_2$, an aluminum oxide ($Al_2O_3$), a zirconium oxide $ZrO_2$, or a zinc oxide (ZnO). The scatterer SCT is not disposed only in the third sub-pixel SPXL3, and may be selectively included in the first color converting layer CCL1 and/or the second color converting layer CCL2. In one or more embodiments, the scatterer SCT may be omitted to provide the scattering layer LSL made of a transparent polymer.

A first capping layer CPL1 may be disposed on the color converting layer CCL. The first capping layer CPL1 may be entirely provided on the first to third sub-pixels SPXL1, SPXL2, and SPXL3. The first capping layer CPL1 may cover the color converting layer CCL. The first capping layer CPL1 may prevent impurities such as moisture or air from penetrating from the outside to damage or contaminate the color converting layer CCL.

The first capping layer CPL1 is an inorganic layer, which may include a silicon nitride (SiNx), an aluminum nitride (AlNx), a titanium nitride (TiNx), a silicon oxide (SiOx), an aluminum oxide (AlOx), a titanium oxide (TiOx), a silicon oxycarbide (SiOxCy), or a silicon oxynitride (SiOxNy).

The optical layer OPL may be disposed on the first capping layer CPL1. The optical layer OPL may serve to improve light extraction efficiency by recycling light provided from the color converting layer CCL by total reflection. To this end, the optical layer OPL may have a relatively low refractive index compared to the color converting layer CCL. For example, the refractive index of the color converting layer CCL may be about 1.6 to 2.0, and the refractive index of the optical layer OPL may be about 1.1 to 1.3.

A second capping layer CPL2 may be disposed on the optical layer OPL. The second capping layer CPL2 may be entirely provided on the first to third sub-pixels SPXL1, SPXL2, and SPXL3. The second capping layer CPL2 may cover the optical layer OPL. The second capping layer CPL2 may prevent impurities such as moisture or air from penetrating from the outside to damage or contaminate the optical layer OPL.

The second capping layer CPL2 is an inorganic layer, which may include a silicon nitride (SiNx), an aluminum nitride (AlNx), a titanium nitride (TiNx), a silicon oxide (SiOx), an aluminum oxide (AlOx), a titanium oxide (TiOx), a silicon oxycarbide (SiOxCy), or a silicon oxynitride (SiOxNy).

A planarization layer PLL may be disposed on the second capping layer CPL2. The planarization layer PLL may be entirely provided on the first to third sub-pixels SPXL1, SPXL2, and SPXL3.

The planarization layer PLL may include an organic material such as an acrylic resin, an epoxy resin, a phenolic resin, a polyamide resin, a polyimide rein, a polyester resin, a polyphenylenesulfide resin, or a benzocyclobutene (BCB). However, it is not necessarily limited thereto, and the planarization layer PLL may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and/or various types of inorganic materials.

The color filter layer CFL may be disposed on the planarization layer PLL. The color filter layer CFL may include color filters CF1, CF2, and CF3 matching the color of each pixel PXL. A full-color image may be displayed by disposing the color filters CF1, CF2, and CF3 matching respective colors of the first to third sub-pixels SPXL1, SPXL2, and SPXL3.

The color filter layer CFL may include the first color filter CF1 that is disposed in the first sub-pixel SPXL1 to selectively transmit light emitted by the first sub-pixel SPXL1, the second color filter CF2 that is disposed in the second sub-pixel SPXL2 to selectively transmit light emitted by the second sub-pixel SPXL2, and the third color filter CF3 that is disposed in the third sub-pixel SPXL3 to selectively transmit light emitted by the third sub-pixel SPXL3.

In one or more embodiments, the first color filter CF1, the second color filter CF2, and the third color filter CF3 may be a red color filter, a green color filter, and a blue color filter respectively, but the present disclosure is not limited necessarily thereto. Hereinafter, when referring to one of the first color filter CF1, the second color filter CF2, and the third color filter CF3, or when comprehensively referring to two or more thereof, it will be referred to as the "color filter CF" or "color filters CF".

The first color filter CF1 may overlap the first color converting layer CCL1 in the thickness direction (for example, the third direction DR3) of the substrate SUB. The first color filter CF1 may include a color filter material that selectively transmits light of a first color (or red color). For example, when the first sub-pixel SPXL1 is a red pixel, the first color filter CF1 may include a red color filter material.

The second color filter CF2 may overlap the second color converting layer CCL2 in the thickness direction (for example, the third direction DR3) of the substrate SUB. The second color filter CF2 may include a color filter material that selectively transmits light of a second color (or green color). For example, when the second sub-pixel SPXL2 is a green pixel, the second color filter CF2 may include a green color filter material.

The third color filter CF3 may overlap the scattering layer LSL in the thickness direction (for example, the third direction DR3) of the substrate SUB. The third color filter CF3 may include a color filter material that selectively transmits light of a third color (or blue color). For example, when the third sub-pixel SPXL3 is a blue pixel, the third color filter CF3 may include a blue color filter material.

In one or more embodiments, a light blocking layer BM may be further disposed between the first to third color filters CF1, CF2, and CF3, and in this case, when the light blocking layer BM is formed between the first to third color filters CF1, CF2, and CF3, it is possible to prevent a color mixing defect viewed from a front or side of a display device DD. The material of the light blocking layer BM is not particularly limited, and may be made of various light blocking materials. For example, the light blocking layer BM may include a black matrix, or may be implemented by stacking the first to third color filters CF1, CF2, and CF3 on each other.

An overcoat layer OC may be disposed on the color filter layer CFL. The overcoat layer OC may be entirely provided on the first to third sub-pixels SPXL1, SPXL2, and SPXL3. The overcoat layer OC may cover the color filter layer CFL and a lower member thereof. The overcoat layer OC may prevent moisture or air from penetrating into the above-mentioned lower members that are disposed therebelow. In addition, the overcoat layer OC may protect the above-mentioned lower members from foreign matters such as dust.

The overcoat layer OC may include an organic material such as an acrylic resin, an epoxy resin, a phenolic resin, a polyamide resin, a polyimide rein, a polyester resin, a polyphenylenesulfide resin, or a benzocyclobutene (BCB). However, it is not necessarily limited thereto, and the overcoat layer OC may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and/or various types of inorganic materials.

The outer film layer OFL may be disposed on the overcoat layer OC. The outer film layer OFL may be disposed at an outer side of the display device DD to reduce external influence. The outer film layer OFL may be entirely provided on the first to third sub-pixels SPXL1, SPXL2, and SPXL3. In one or more embodiments, the outer film layer OFL may include one selected from among a polyethylene-terephthalate (PET) film, a low reflective film, a polarization film, and a transmittance controllable film, but is not necessarily limited thereto. In one or more embodiments, the pixel PXL may include an upper substrate rather than the outer film layer OFL.

Next, a structure of the pixel PXL in which the normally operable light emitting elements LD are aligned will be described with reference to FIG. 12 to FIG. 20. Descriptions that may be redundant to those described above are omitted or are not repeated.

Figure 12:
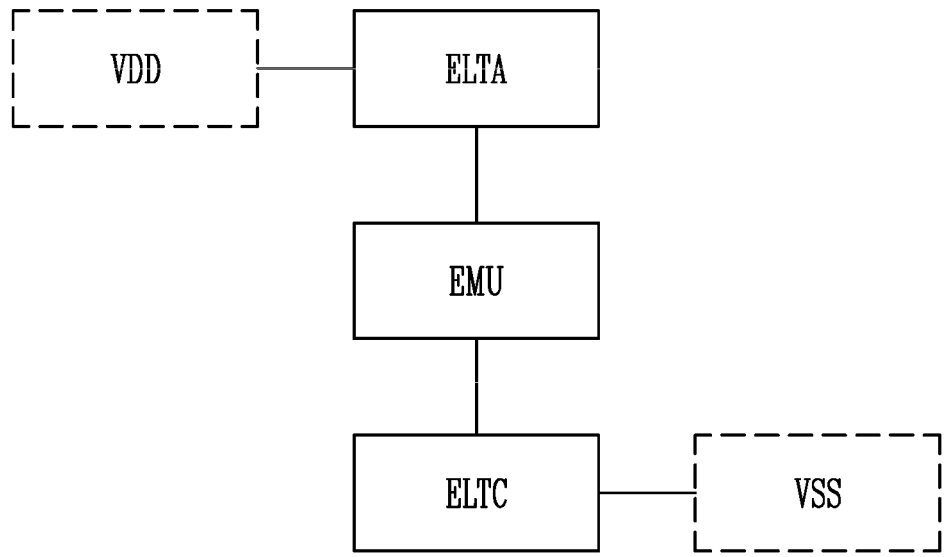
FIG. 12 and FIG. 13 illustrate schematic block diagrams of an electrical connection structure for a light emitting unit according to one or more embodiments.
Figure 13:
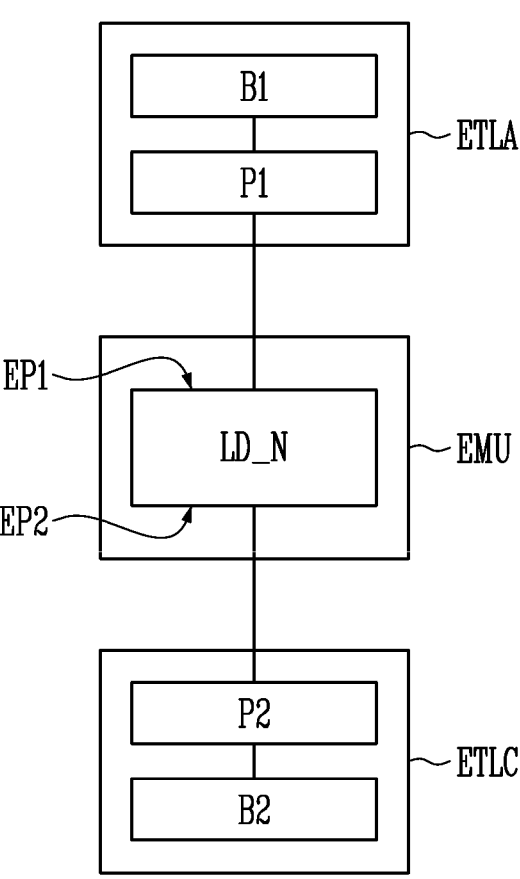

First, a current path in the pixel PXL will be described with reference to FIG. 12 and FIG. 13. FIG. 12 and FIG. 13 illustrate schematic block diagrams of an electrical connection structure for a light emitting unit according to one or more embodiments.

Referring to FIG. 12 and FIG. 13, the light emitting unit EMU including light emitting elements LD may be electrically connected between the anode connecting electrode ELTA and the cathode connecting electrode ELTC. In this case, the anode connecting electrode ELTA may be electrically connected to a first power line VDD configured to supply a first power voltage, and the cathode connecting electrode ELTC may be electrically connected to a second power line VSS configured to supply a second power voltage having a different potential from (or a lower potential than) the first power voltage. Accordingly, a current path in one direction before and after the light emitting unit EMU may be defined.

According to one or more embodiments, when the current path is normally defined, the light emitting element LD may normally operate. For example, the light emitting element LD may include a normal light emitting element LD_N. Here, the normal light emitting element LD_N may refer to at least one light emitting element LD normally electrically connected between the anode connecting electrode ELTA and the cathode connecting electrode ELTC from among the light emitting elements LD. In one or more embodiments, the normal light emitting elements LD_N may be referred to as first light emitting elements.

The normal light emitting elements LD_N may be connected to the first protruding portion P1 of the anode connecting electrode ELTA. For example, the first end EP1 of the normal light emitting elements LD_N may be in physical contact with the first protruding portion P1. The normal light emitting elements LD_N may be connected to the second protruding portion P2 of the cathode connecting electrode ELTC. For example, the second end EP2 of the normal light emitting elements LD_N may be in physical contact with the second protruding portion P2.

Figure 14:
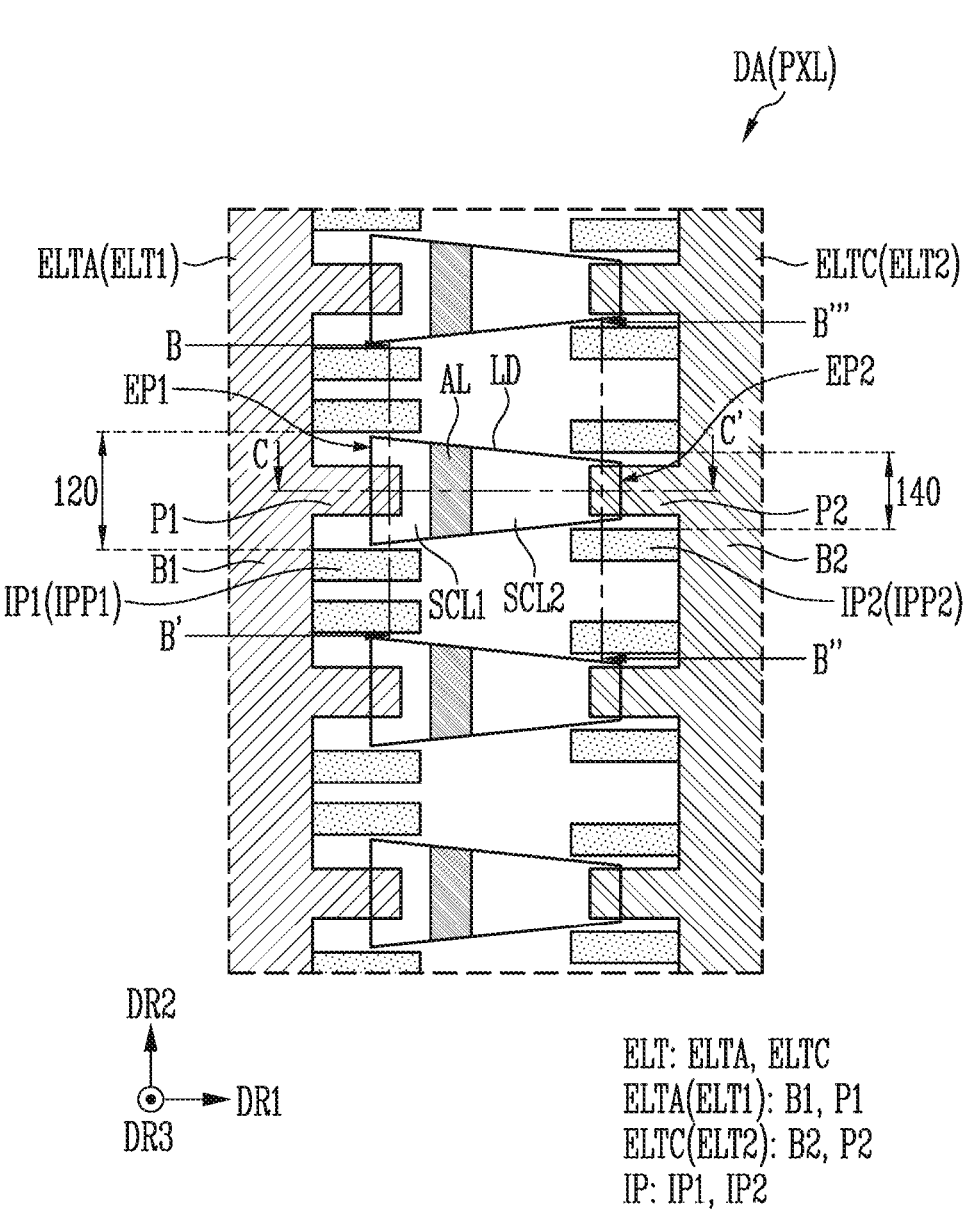
Figure 19:
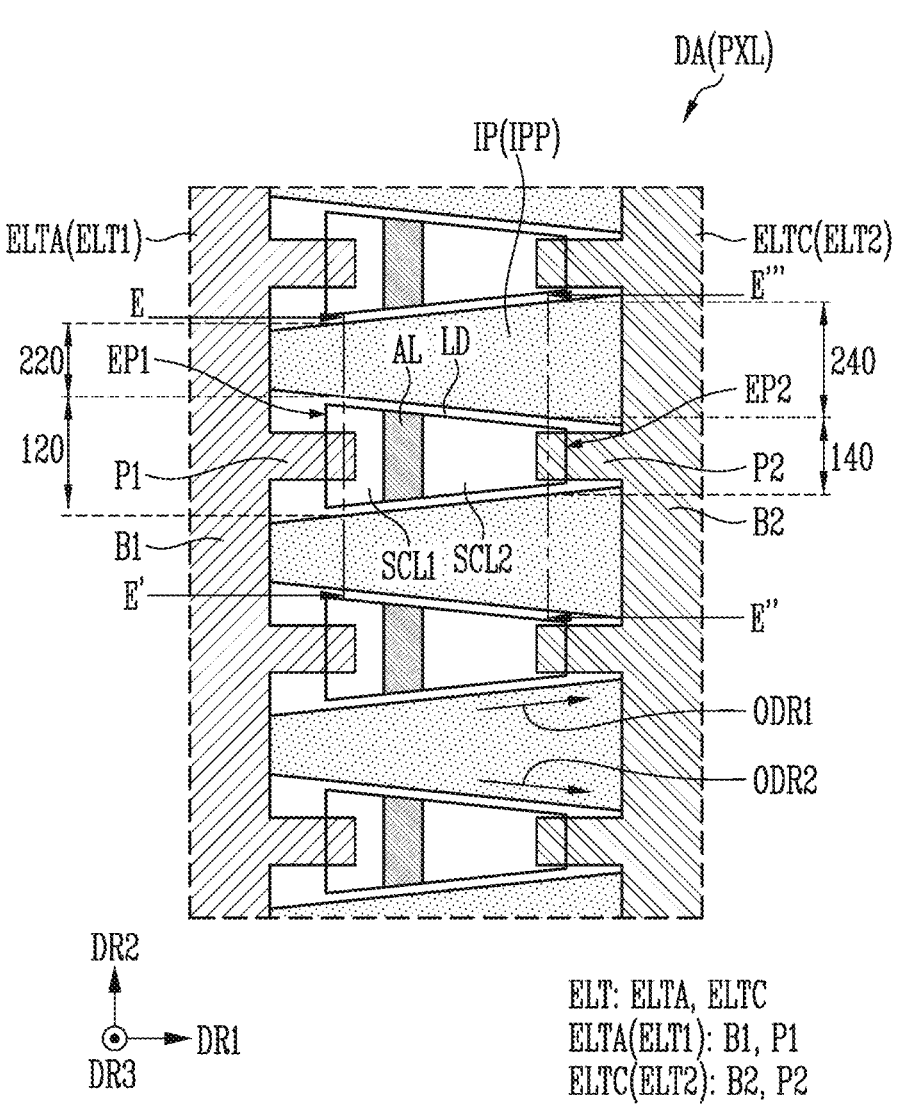

Hereinafter, structures of the protruding patterns IP, the light emitting elements LD, and the connecting electrodes ELT according to one or more embodiments will be described in detail with reference to FIG. 14 to FIG. 20. FIG. 14 to FIG. 20 schematically illustrate structures of a pixel including protruding patterns according to one or more embodiments. The above-described normal light emitting elements LD_N from among the light emitting elements LD are illustrated in FIG. 14 to FIG. 20. For better understanding and ease of description, the normal light emitting elements LD_N are referred to as light emitting elements LD. In FIG. 14, FIG. 17, and FIG. 19, for better understanding and ease of description, the electrodes ALE are not shown.

First, a pixel PXL including protruding patterns IP according to a first embodiment will be described with reference to FIG. 14 to FIG. 16. Descriptions that may be redundant to those described above are omitted or are not repeated.

Figure 15:
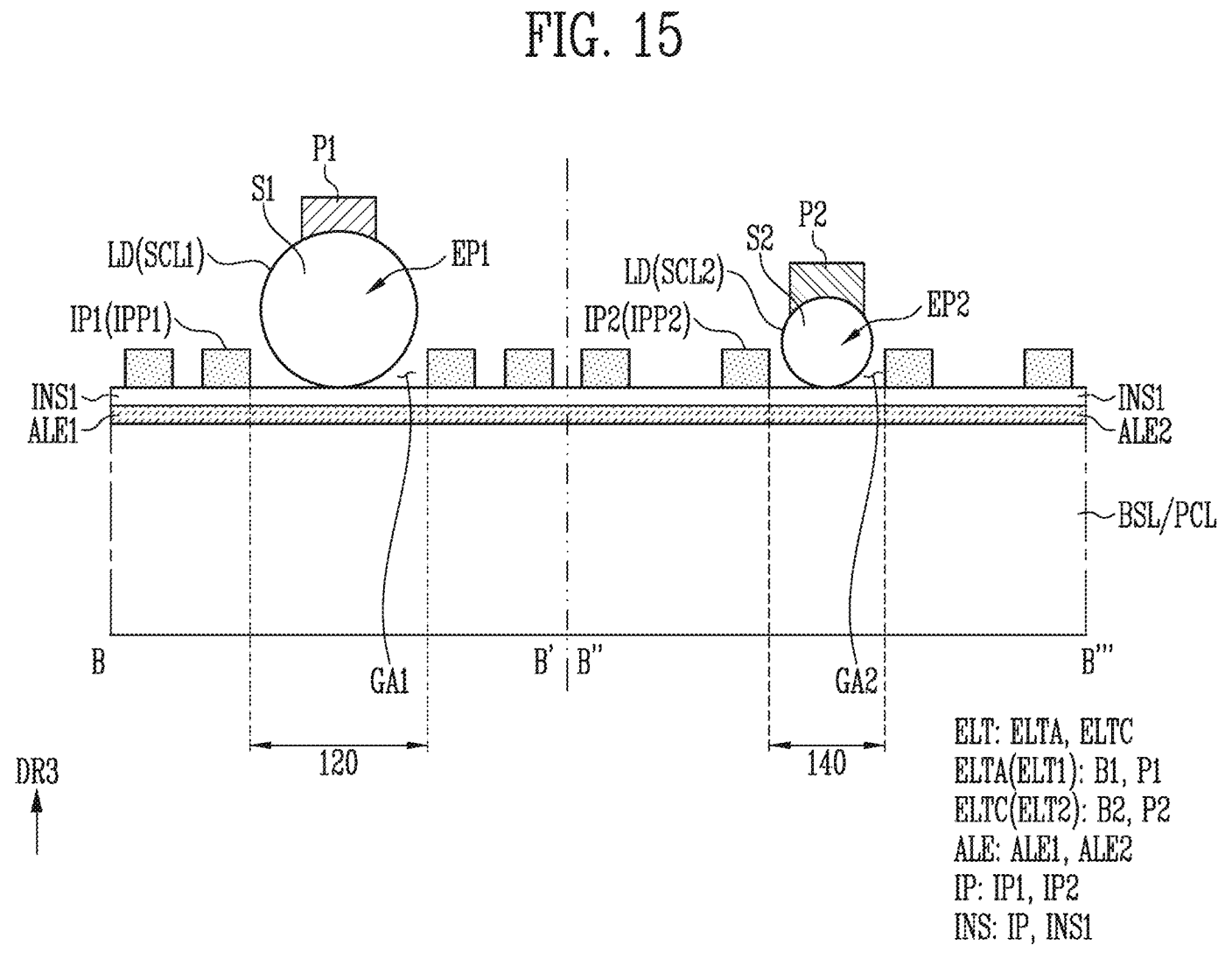
Figure 16:
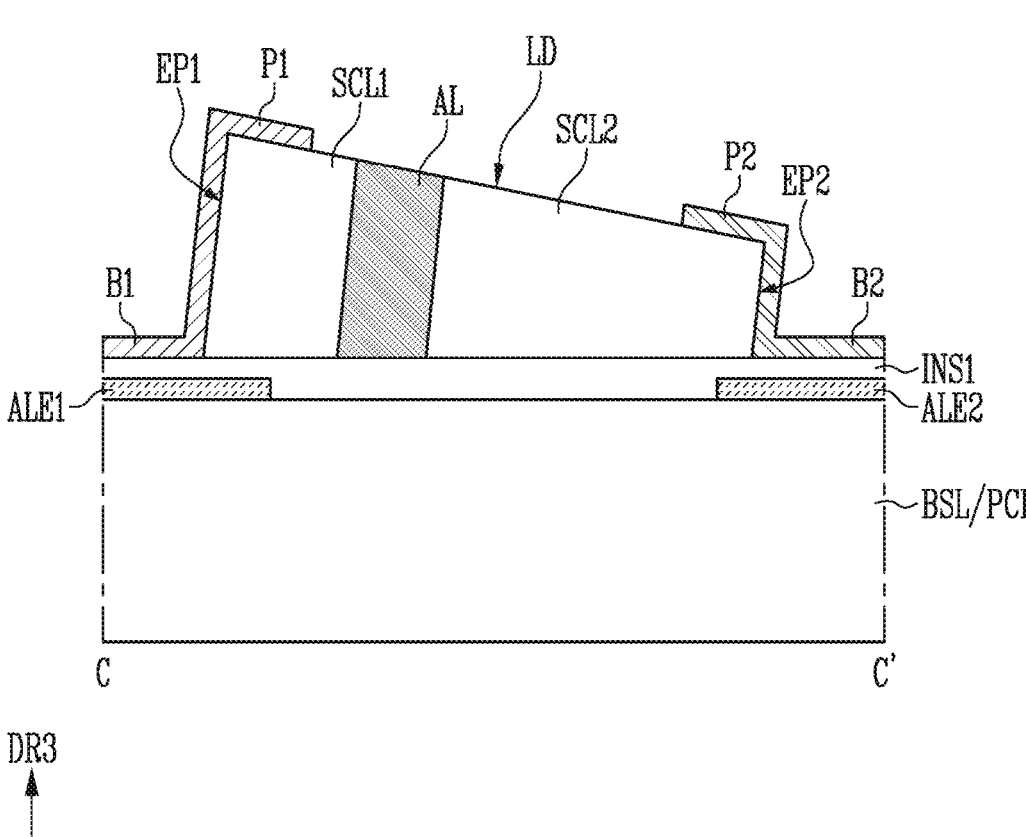
Figure 17:
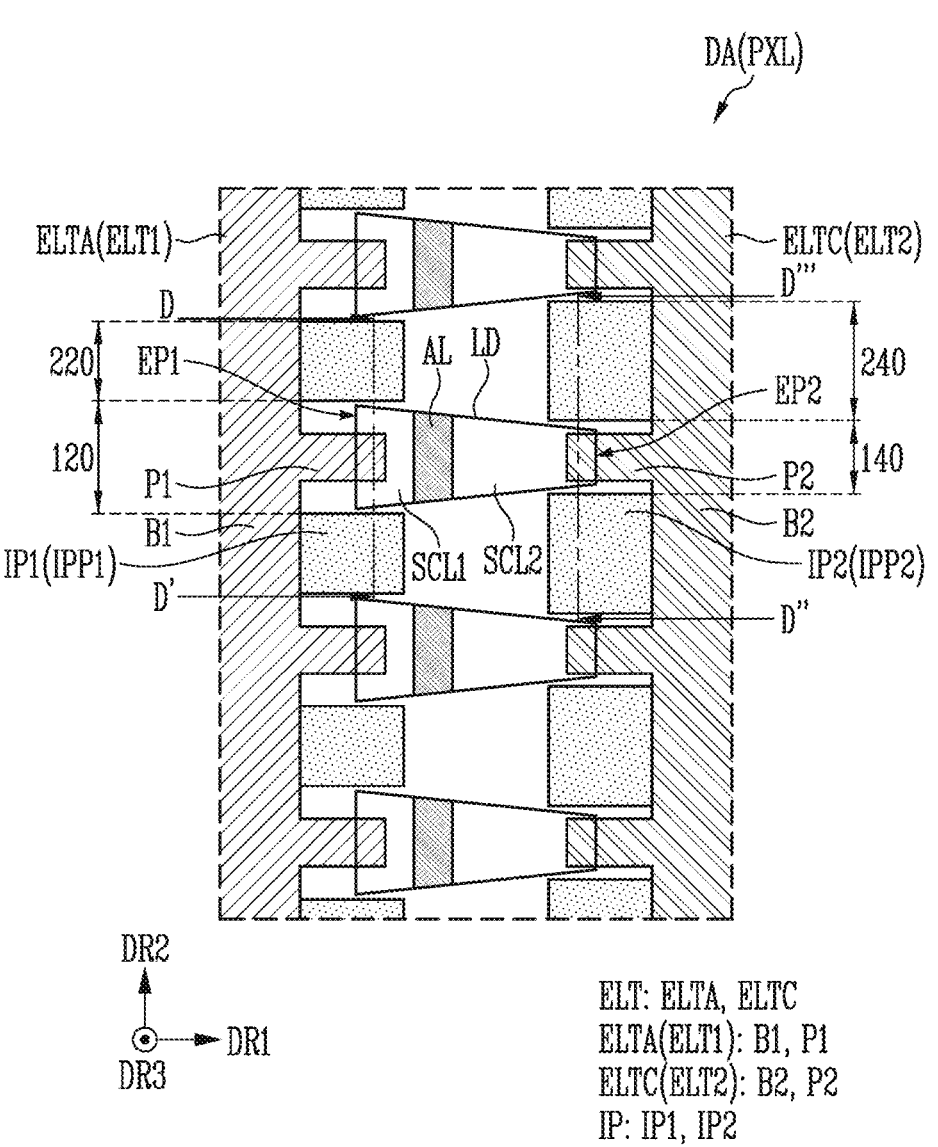

FIG. 14 to FIG. 16 may schematically illustrate the pixel PXL including the protruding patterns IP according to a first embodiment. FIG. 14 illustrates a schematic top plan view of the pixel PXL according to the first embodiment. FIG. 15 illustrates a schematic cross-sectional view taken along the line B-B''' of FIG. 14. FIG. 16 illustrates a schematic cross-sectional view taken along the line C-C' of FIG. 14.

Referring to FIG. 14, the position at which the light emitting elements LD are disposed may correspond to pairs of the first and second protruding portions P1 and P2. For example, the first end EP1 of the light emitting elements LD may be spaced from the first base portion B1, the second end EP2 of the light emitting elements LD may be spaced from the second base portion B2, and the first and second ends EP1 and EP2 of the light emitting elements LD may respectively correspond to the adjacent first and second protruding portions P1 and P2.

According to one or more embodiments, the protruding patterns IP may be disposed on the base layer BSL. The protruding patterns IP may include the first protruding patterns IP1 adjacent to the first connecting electrode ELT1 and the first end EP1 of the light emitting elements LD, and the second protruding patterns IP2 adjacent to the second connecting electrode ELT2 and the second end EP2 of the light emitting elements LD.

According to one or more embodiments, the protruding patterns IP may be disposed between the protruding portions P1 and P2 that are adjacent to each other. For example, the first protruding patterns IP1 may be disposed between the first protruding portions P1. The second protruding patterns IP2 may be disposed between the second protruding portions P2. For example, the first protruding patterns IP1 may include first protruding spacing patterns IPP1 spaced from each other with the first protruding portions P1 interposed therebetween. The second protruding patterns IP2 may include second protruding spacing patterns IPP2 spaced from each other with the second protruding portions P2 interposed therebetween.

According to one or more embodiments, each of the first protruding spacing patterns IPP1 may correspond to one adjacent first protruding portion P1. For example, two or more first protruding spacing patterns IPP1 may be disposed between adjacent first protruding portions P1. Accordingly, one of the first protruding spacing patterns IPP1 disposed between the adjacent first protruding portions P1 may correspond to an upwardly adjacent first protruding portion P1, and the other one of the first protruding spacing patterns IPP1 may correspond to a downwardly adjacent first protruding portion P1.

According to one or more embodiments, each of the second protruding spacing patterns IPP2 may correspond to one adjacent second protruding portion P2. For example, two or more second protruding spacing patterns IPP2 may be disposed between adjacent second protruding portions P2. Accordingly, one of the second protruding spacing patterns IPP2 disposed between the adjacent second protruding portions P2 may correspond to an upwardly adjacent second protruding portion P2, and the other one of the second protruding spacing patterns IPP2 may correspond to a downwardly adjacent second protruding portion P2. For example, two or more second protruding spacing patterns IPP2 may be disposed between the adjacent second protruding portions P2. Accordingly, one of the second protruding spacing patterns IPP2 disposed between the adjacent second protruding portions P2 may correspond to an upwardly adjacent second protruding portion P2, and the other one of the second protruding spacing patterns IPP2 may correspond to a downwardly adjacent second protruding portion P2.

According to one or more embodiments, the first protruding spacing patterns IPP1 may be spaced from each other by a first distance 120. For example, the first protruding spacing patterns IPP1 may be spaced from each other by the first distance 120 in an extending direction of the first base portion B1 (or a direction different from an extending direction of the first protruding portion P1, e.g., a second direction DR2). The second protruding spacing patterns IPP2 may be spaced from each other by a second distance 140. For example, the second protruding spacing patterns IPP2 may be spaced from each other by the second distance 140 in an extending direction of the second base portion B2 (or a direction different from an extending direction of the second protruding portion P2, e.g., the second direction DR2).

According to one or more embodiments, the protruding patterns IP define a space in which each of the light emitting elements LD may be easily disposed, so that the alignment position of the light emitting elements LD may be substantially determined. For example, the first end EP1 of the light emitting elements LD may be disposed between the first protruding spacing patterns IPP1, and the second end EP2 of the light emitting elements LD may be disposed between the second protruding spacing patterns IPP2. In this case, the positions at which the light emitting elements LD are aligned may be substantially defined, and when the connecting electrodes ELT are patterned after the light emitting elements LD are aligned, electrical connection between the light emitting elements LD and the connecting electrodes ELT may be clearly formed.

Particularly, the light emitting elements LD may be electrically connected to the protruding portions P1 and P2, and in this case, the position of each of the protruding portions P1 and P2 may correspond to each of the first protruding pattern IP1 and the second protruding pattern IP2. That is, because the light emitting elements LD aligned based on the positions of the protruding patterns IP are electrically connected to the protruding portions P1 and P2 organically related to the positions of the protruding patterns IP, the alignment of the light emitting elements LD may be improved, and the current path for the light emitting elements LD may be clearly defined.

According to one or more embodiments, the first distance 120 for the first protruding spacing patterns IPP1 and the second distance 140 for the second protruding spacing patterns IPP2 may be different from each other. For example, the first distance 120 may be larger than the second distance 140. The related contents will be described with reference to FIG. 15.

According to one or more embodiments, the insulating layer INS may include the first insulating film INS1 and the protruding patterns IP. As described above, the protruding patterns IP may be formed in a same process as the first insulating film INS1, or may be formed in a different process therefrom.

According to one or more embodiments, the first distance 120 may be larger than the second distance 140. In one or more embodiments, the first distance 120 may be larger than a diameter of the first surface S1 corresponding to the first end EP1 of the light emitting element LD. The second distance 140 may be larger than a diameter of the second surface S2 corresponding to the second end EP2 of the light emitting element LD.

Accordingly, a portion corresponding to the first end EP1 of the light emitting elements LD may be provided in a first groove area GA1 formed by the first protruding spacing pattern IPP1. In addition, a portion corresponding to the second end EP2 of the light emitting elements LD may be provided in a second groove area GA2 formed by the second protruding spacing pattern IPP2. In this case, the first end EP1 of the light emitting element LD may be electrically connected to the first protruding portion P1, and the second end EP2 of the light emitting element LD may be electrically connected to the second protruding portion P2. This will be described with reference to FIG. 16.

The normally operable light emitting elements LD (that is, the normal light emitting elements LD_N) may be provided in the groove areas GA1 and GA2 to contact the insulating layer INS (e.g., the first insulating layer INS1). For example, referring to FIG. 16, one side surface corresponding to each of the first and second ends EP1 and EP2 of the normally operable light emitting elements LD may be in contact on the insulating layer INS (e.g., the first insulating layer INS1). In this case, a separation space may not be generated (or minimized) between the light emitting elements LD and the insulating layer INS (e.g., the first insulating layer INS1), and the first and second ends EP1 and EP2 of the light emitting elements LD may be electrically connected to the first and second protruding portions P1 and P2, respectively. In other words, when the separation space is generated, there may be a risk that the first and second ends EP1 and EP2 of the light emitting elements LD are not electrically connected to the first and second protruding portions P1 and P2, respectively. According to one or more embodiments, the risk may be substantially prevented or reduced. The aforementioned risk will be described in detail later with reference to FIG. 25.

Next, a pixel PXL including protruding patterns IP according to a second embodiment will be described with reference to FIG. 17 and FIG. 18. Descriptions that may be redundant to those described above the above are omitted or are not repeated.

Figure 18:
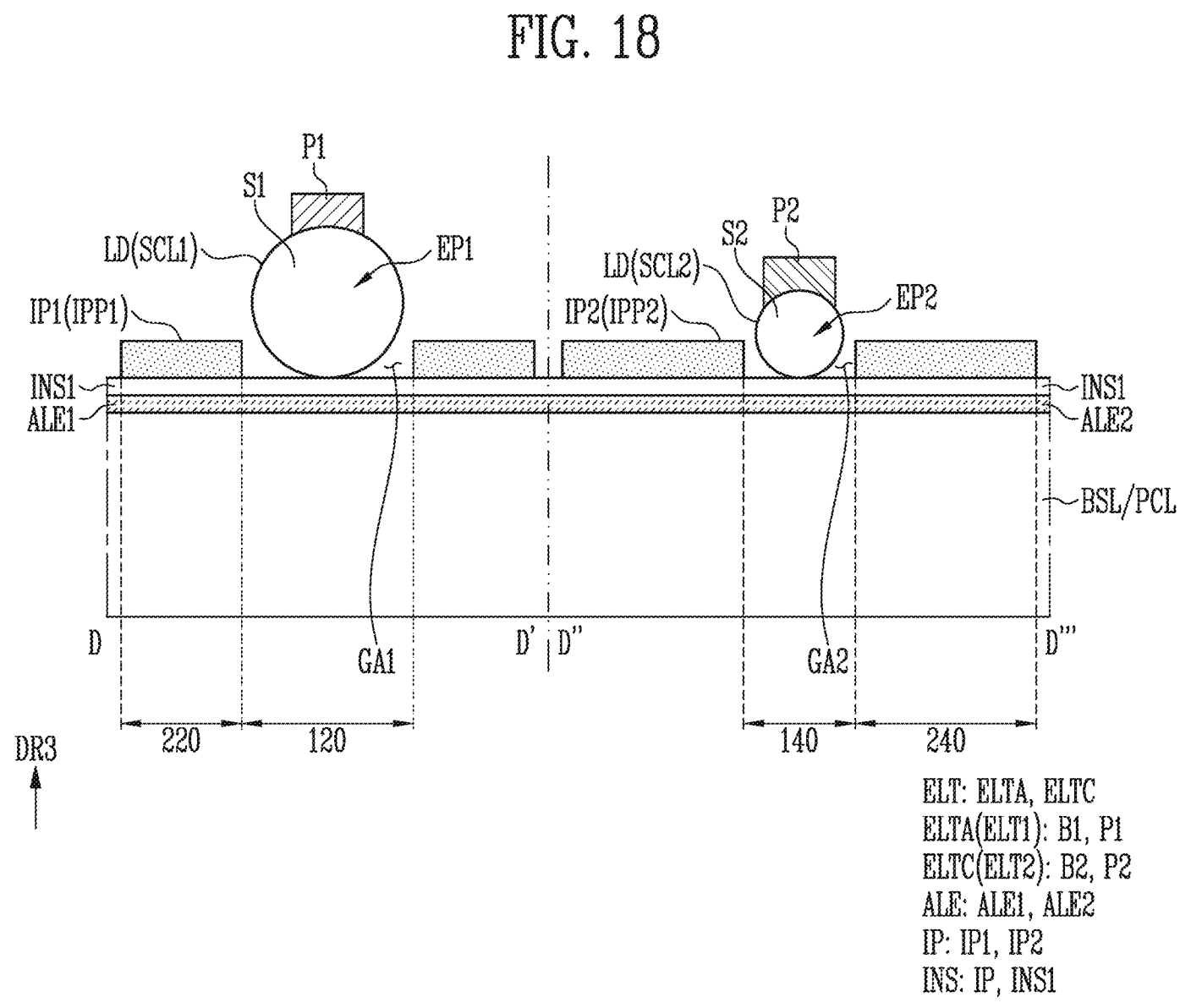

FIG. 17 to FIG. 18 may schematically illustrate the pixel PXL including the protruding patterns IP according to the second embodiment. FIG. 17 illustrates a schematic top plan view of the pixel PXL according to the second embodiment. FIG. 18 illustrates a schematic cross-sectional view taken along the line D-D''' of FIG. 17.

The pixel PXL according to the second embodiment is different from the pixel PXL according to the first embodiment in that a single number of each of the first protruding spacing patterns IPP1 is disposed between the adjacent first protruding portions P1, and a single number of each of the second protruding spacing patterns IPP2 is disposed between the adjacent second protruding portions P2.

Referring to FIG. 17 and FIG. 18, one end of one of the first protruding spacing patterns IPP1 may be adjacent to one of the first protruding portions P1, and the other end thereof may be adjacent to the other one of the first protruding portions P1. One end of one of the second protruding spacing patterns IPP2 may be adjacent to one of the second protruding portions P2, and the other end thereof may be adjacent to the other one of the second protruding portions P2. In addition, similar to that described above, in order to form protruding patterns IP for disposing the light emitting elements LD, a first length 220 in one direction of the first protruding spacing patterns IPP1 may be smaller than a second length 240 in one direction of the second protruding spacing patterns IPP2. Accordingly, the protruding patterns IP may be formed so that the first length 220 may be greater than the second length 240.

That is, according to one or more embodiments, one of the first protruding spacing patterns IPP1 may form a step for disposing the light emitting elements LD corresponding to two or more first protruding portions P1. One of the second protruding spacing patterns IPP2 may form a step for disposing the light emitting elements LD corresponding to two or more second protruding portions P2. In this case, a process for patterning the first and second protruding spacing patterns IPP1 and IPP2 may be relatively simplified.

According to one or more embodiments, the first end EP1 of the light emitting elements LD may be disposed between the first protruding spacing patterns IPP1 to contact the insulating layer INS (e.g., the first insulating layer INS1), and the second end EP2 of the light emitting elements LD may be disposed between the second protruding spacing patterns IPP2 to contact the insulating layer INS (e.g., the first insulating layer INS1), and thus, they may be normally and electrically connected the first protruding portion P1 and the second protruding portion P2. The second end EP2 of the light emitting elements LD may contact the insulating layer INS (e.g., the first insulating layer INS1), and thus may be normally electrically connected to the second protruding portion P2.

Next, a pixel PXL including protruding patterns IP according to a third embodiment will be described with reference to FIG. 19 and FIG. 20. Descriptions that may be redundant to those described above are omitted or are not repeated.

Figure 20:
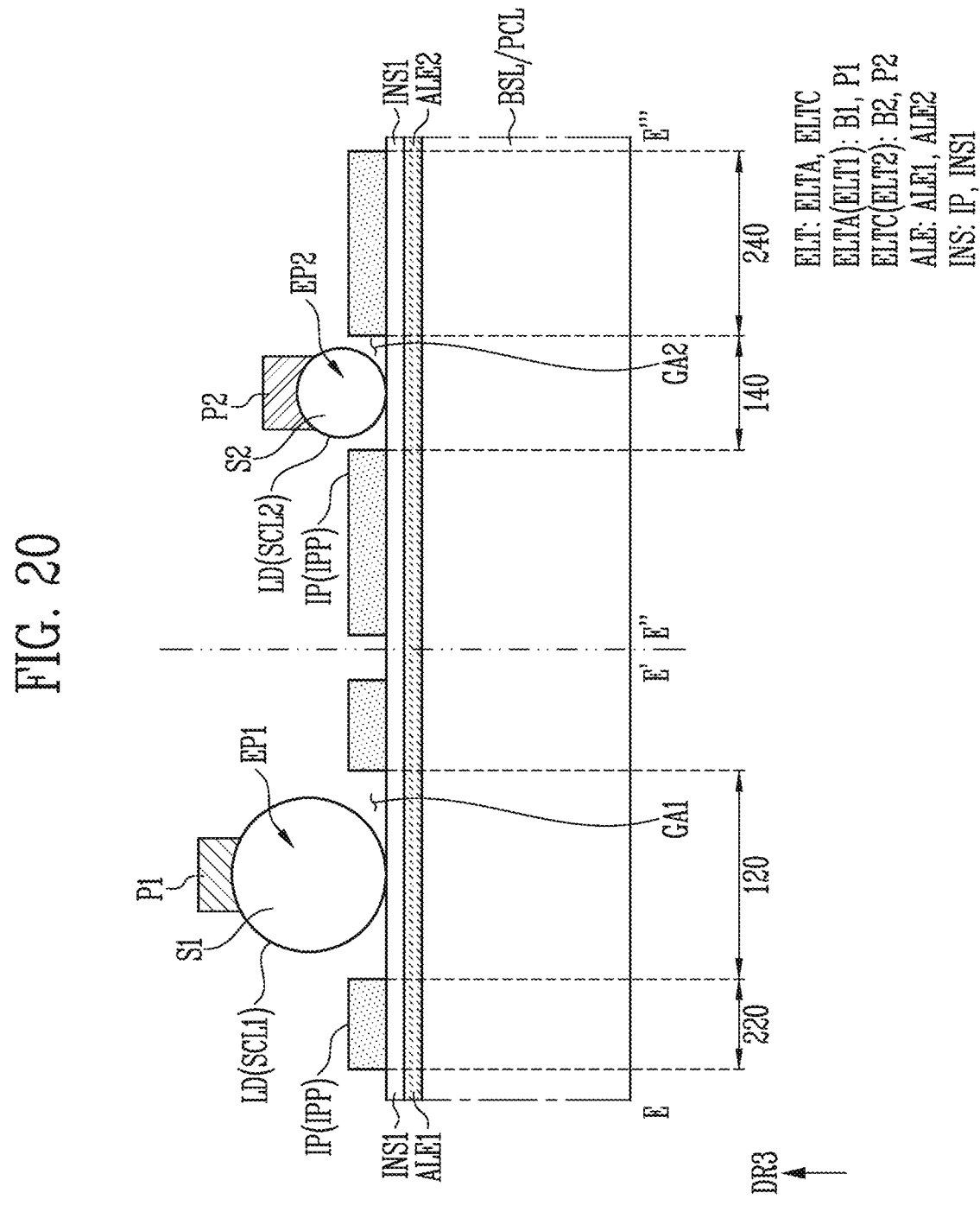

FIG. 19 and FIG. 20 may schematically illustrate the pixel PXL including the protruding patterns IP according to the third embodiment. FIG. 19 illustrates a schematic top plan view of the pixel PXL according to the third embodiment. FIG. 20 illustrates a schematic cross-sectional view taken along the line E-E''' of FIG. 19.

The pixel PXL according to the third embodiment is different from the pixel PXL according to the second embodiment in that the first protruding patterns IP1 and the second protruding patterns IP2 are integrally formed.

Referring to FIG. 19 and FIG. 20, the first protruding patterns IP1 and the second protruding patterns IP2 may be integrally formed with each other. In one or more embodiments, the integrally formed first and second protruding spacing patterns IPP1 and IPP2 may be referred to as a protruding spacing pattern IPP.

According to one or more embodiments, the integrally formed protruding spacing patterns IPP may have trapezoidal shapes. For example, one surface of the protruding spacing patterns IPP adjacent to the first protruding portion P1 and the anode connecting electrode ELTA may be smaller than the other surface of the protruding spacing patterns IPP adjacent to the second protruding portion P2 and the cathode connecting electrode ELTC. In one or more embodiments, side surfaces of the protruding spacing patterns IPP may be disposed (or formed) to correspond to side surfaces of the adjacent light emitting elements LD. For example, one side surface of the protruding spacing patterns IPP may extend in a first diagonal direction ODR1, and one side surface of the opposite light emitting element LD may extend in the first diagonal direction ODR1. The other side surface of the protruding spacing patterns IPP may extend in a second diagonal direction ODR2, and the other side surface of the opposite light emitting element LD may extend in the second diagonal direction ODR2. According to the present embodiment, the protruding spacing patterns IPP for forming a step to define positions of the light emitting elements LD are disposed to extend between the anode connecting electrode ELTA and the cathode connecting electrode ELTC, so that alignment of the light emitting elements LD may be further improved.

According to one or more embodiments, similarly as described above, the protruding spacing patterns IPP are patterned such that the first length 220 is smaller than the second length 240, so that the first distance 120 may be larger than the second distance 140. Accordingly, the first end EP1 of the light emitting elements LD may contact with the insulating layer INS (e.g., the first insulating layer INS1), and thus may be normally electrically connected to the first protruding portion P1. The second end EP2 of the light emitting elements LD may contact with the insulating layer INS (e.g., the first insulating layer INS1), and thus may be normally electrically connected to the second protruding portion P2.

Hereinafter, a structure of the pixel PXL in which partially abnormally aligned light emitting elements LD are aligned, but that may normally operate without electrical defects will be described with reference to FIG. 21 to FIG. 25. Descriptions that may be redundant to those described above are omitted or are not repeated.

Figure 21:
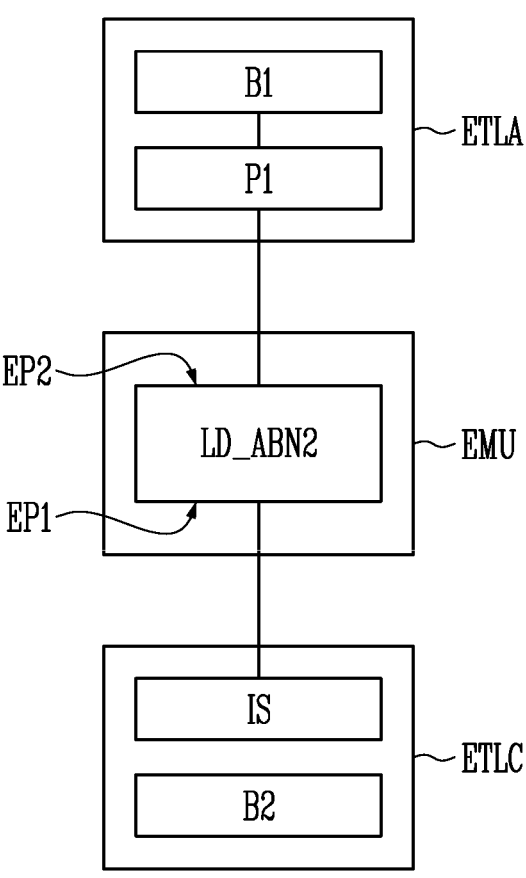
FIG. 21 illustrates a schematic block diagram of an electrical connection structure for a light emitting unit.

First, a current path in the pixel PXL including the abnormally aligned light emitting elements LD will be described with reference to FIG. 21. FIG. 21 illustrates a schematic block diagram of an electrical connection structure for a light emitting unit EMU.

Referring to FIG. 21, the light emitting elements LD may be abnormally aligned according to an alignment state. For example, the light emitting elements LD may include second abnormal light emitting elements LD_ABN2. Experimentally, in order for the light emitting elements LD to be supplied on the base layer BSL and normally operate, a directions of the light emitting elements LD should be normally defined. For example, in order for the light emitting element LD to normally operate, it is necessary that the first end EP1 adjacent to the first semiconductor layer SCL1 is directed to the anode connecting electrode ELTA (for example, the first protruding portion P1), and the second end EP2 adjacent to the second semiconductor layer SCL2 is directed to the cathode connecting electrode ELTC (for example, the second protruding portion P2). In this case, conversely, when the first end EP1 is directed to the cathode connecting electrode ELTC and the second end EP2 is directed to the anode connecting electrode ELTA, a current path from the pixel PXL to the light emitting element LD may not be clearly defined, and in this case, the light emitting elements LD (that is, the second abnormal light emitting elements LD_ABN2) may not be configured to emit light. According to one or more embodiments, due to the structure of the protruding patterns IPP as described above, the light emitting elements LD may be arranged such that the current path may clearly defined.

Further, according to one or more embodiments, it is necessary that the second abnormal light emitting elements LD_ABN2 are not electrically connected between the anode connecting electrode ELTA and the cathode connecting electrode ELTC. The first end EP1 (for example, an area adjacent to a p-type semiconductor) of the second abnormal light emitting elements LD_ABN2 may be directed to the cathode connecting electrode ELTC, and the second end EP2 (for example, an area adjacent to an n-type semiconductor) thereof may be directed to the anode connecting electrode ELTA. In this case, a short circuit defect may occur between the anode connecting electrode ELTA and the cathode connecting electrode ELTC. However, in one or more embodiments, the second abnormal light emitting elements LD_ABN2 may be connected to an isolated portion IS without being connected to the second base portion B2 of the cathode connecting electrode ELTC, and accordingly, the second abnormal light emitting elements LD_ABN2 may not electrically connect the anode connecting electrode ELTA and the cathode connecting electrode ELTC, and eventually a short circuit defect may be prevented.

Hereinafter, an arrangement structure of the abnormally arranged light emitting elements LD will be described in detail with reference to FIG. 22 to FIG. 25.

Figure 22:
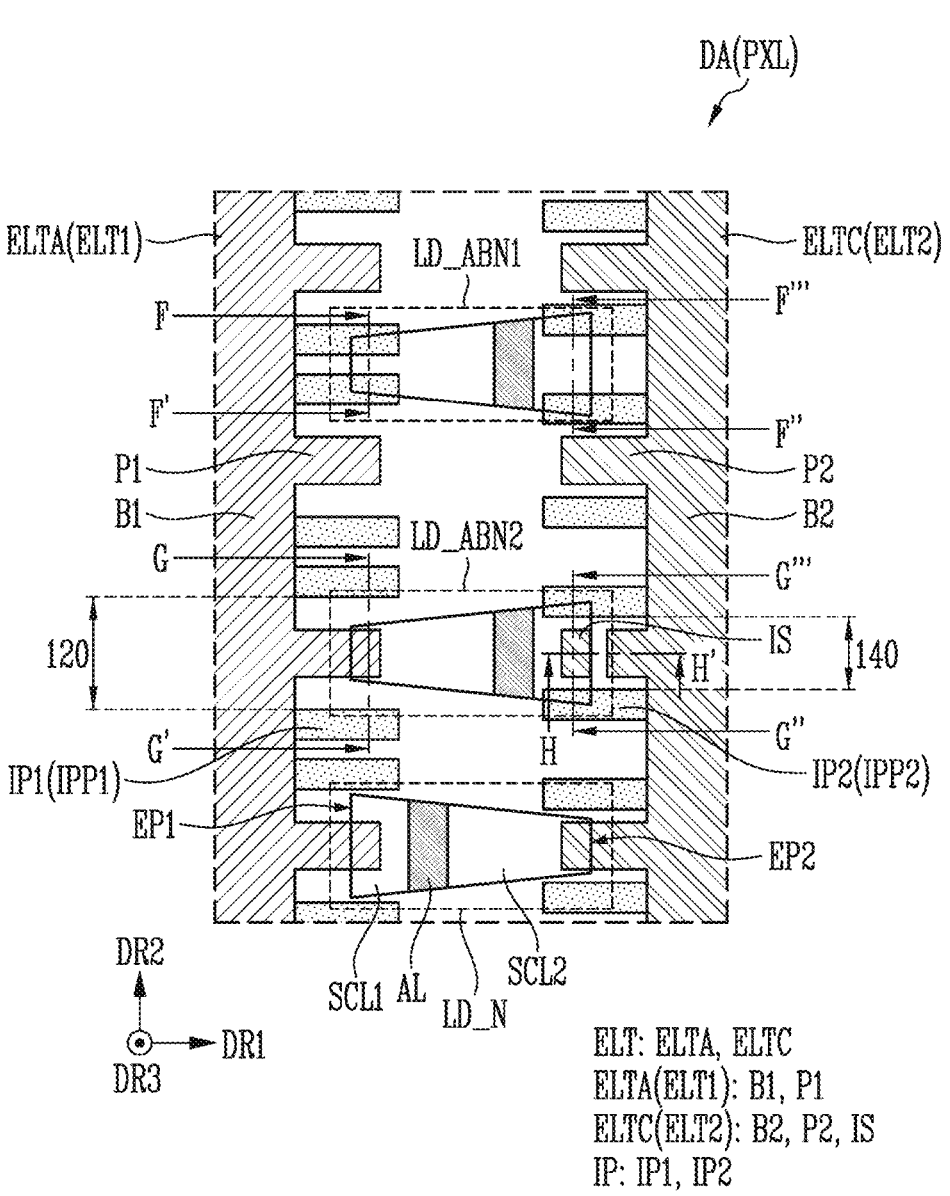
FIG. 22 to FIG. 25 schematically illustrate structures of a pixel including protruding patterns according to one or more embodiments.
Figure 23:
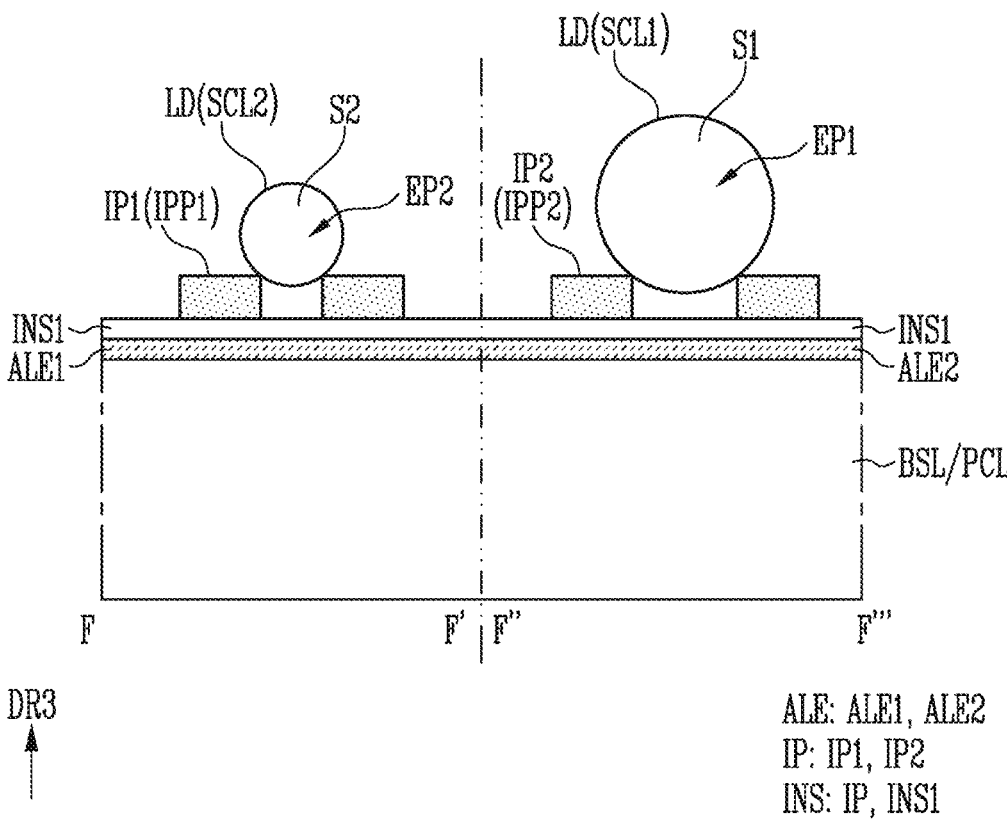
Figure 24:
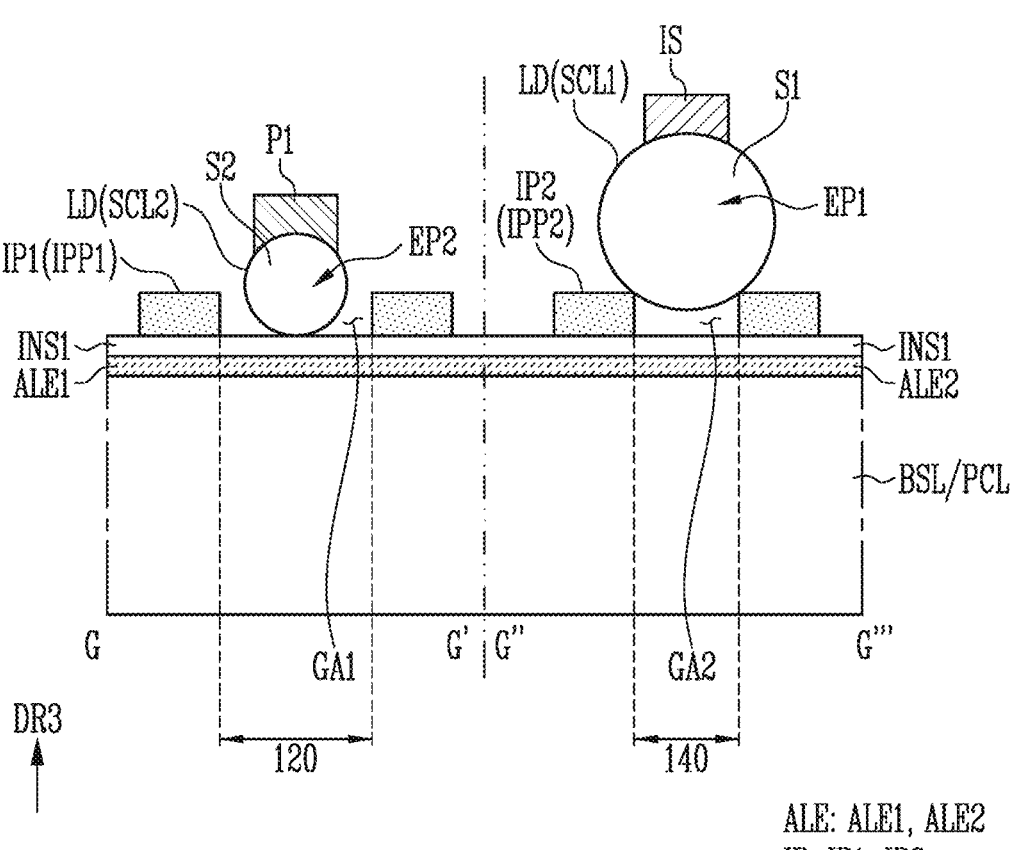
Figure 25:
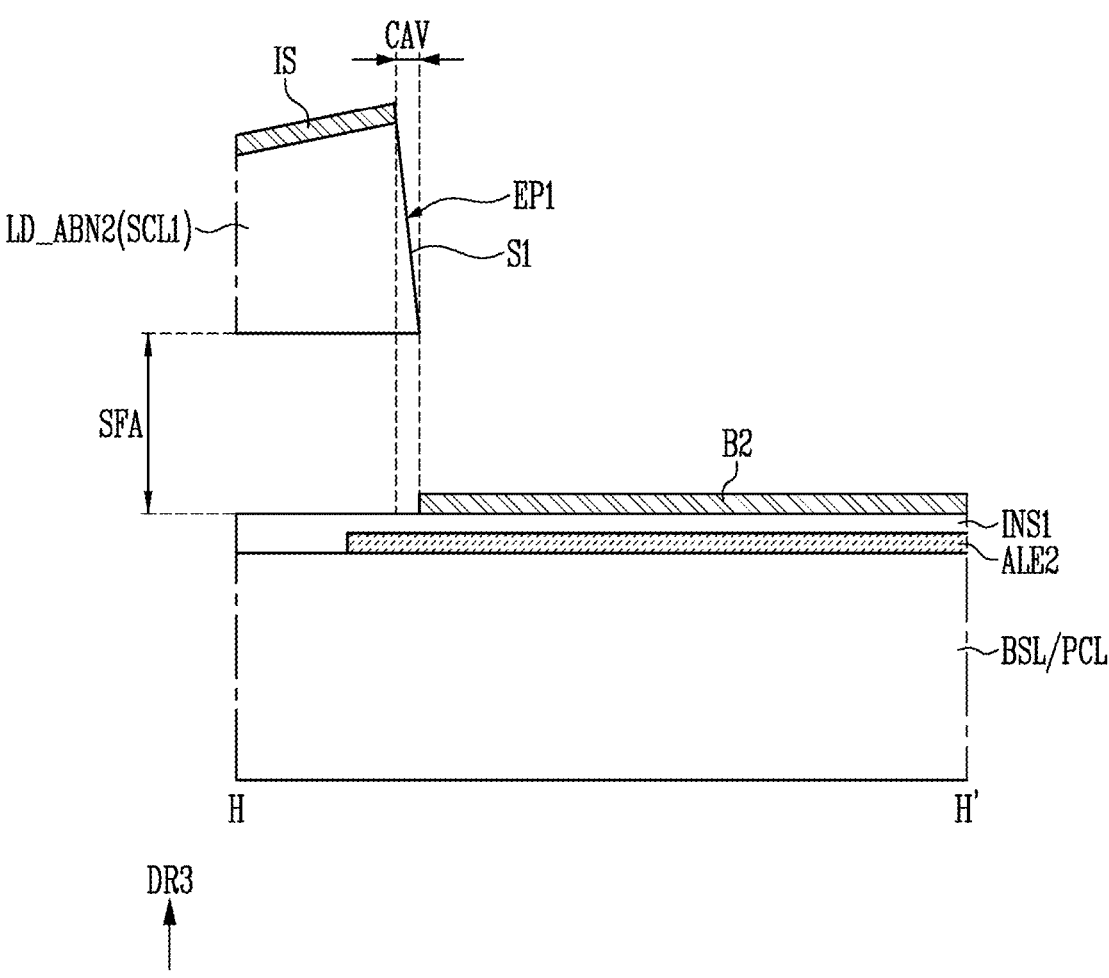

FIG. 22 to FIG. 25 schematically illustrate structures of a pixel including protruding patterns according to one or more embodiments. FIG. 22 illustrates a schematic top plan view of the pixel PXL according to one or more embodiments. For example, FIG. 22 illustrates the pixel PXL including the abnormally aligned light emitting elements LD. FIG. 23 illustrates a schematic cross-sectional view taken along the lines F-F' and F"-F'" of FIG. 22. FIG. 24 illustrates a schematic cross-sectional view taken along the lines G-G' and G"-G'" of FIG. 22. FIG. 25 illustrates a schematic cross-sectional view taken along the line H-H' of FIG. 22.

Referring to FIG. 22 to FIG. 25, the light emitting elements LD may include the normally aligned normal light emitting elements LD_N, the first abnormal light emitting elements LD_ABN1 that are abnormally aligned light emitting elements, and the second abnormal light emitting elements LD_ABN2. In one or more embodiments, the first abnormal light emitting elements LD_ABN1 may be referred to as second light emitting elements. The second abnormal light emitting elements LD_ABN2 may be referred to as third light emitting elements. For reference, details regarding the first abnormal light emitting elements LD_ABN1 may be understood with reference to FIG. 22 and FIG. 23. For reference, details regarding the second abnormal light emitting elements LD_ABN2 may be understood with reference to FIG. 22, FIG. 24, and FIG. 25.

According to one or more embodiments, a polarity direction of each of the first abnormal light emitting elements LD_ABN1 and the second abnormal light emitting elements LD_ABN2 is abnormally arranged, but may not be electrically connected to the anode connecting electrode ELTA and the cathode connecting electrode ELTC. For example, the first end EP1 of each of the first abnormal light emitting elements LD_ABN1 and the second abnormal light emitting elements LD_ABN2 may face the cathode connecting electrode ELTC, and the second end EP2 thereof may face the anode connecting electrode ELTA.

The first abnormal light emitting elements LD_ABN1 may refer to one or more of the light emitting elements LD that are disposed to not correspond to the pair of the first and second protruding portions P1 and P2. For example, the first end EP1 of the first abnormal light emitting elements LD_ABN1 may contact the second protruding patterns IP2, and the second end EP2 thereof may contact the first protruding patterns IP1. As described above, because the first protruding portion P1 is disposed between the first protruding spacing patterns IPP1 and the second protruding portion P2 is disposed between the second protruding spacing patterns IPP2, the first abnormal light emitting elements LD_ABN1 may not be electrically connected to the first and second protruding portions P1 and P2.

The second abnormal light emitting elements LD_ABN2 may refer to one or more of the light emitting elements LD that are disposed to correspond to the pair of the first and second protruding portions P1 and P2 and are connected to the isolated portion IS. For example, the second end EP2 of the second abnormal light emitting elements LD_ABN2 may contact the first protruding portion P1, and the first end EP1 of the second abnormal light emitting elements LD_ABN2 may contact the isolated portion IS without being physically connected to the second base portion B2. In this case, the second abnormal light emitting elements LD_ABN2 may be electrically separated from the second base portion B2, and accordingly, a current path through the second abnormal light emitting elements LD_ABN2 may not be defined.

A structure in which the second abnormal light emitting elements LD_ABN2 does not form a current path will be described in detail with reference to FIG. 25. In one or more embodiments, the light emitting elements LD may have an asymmetric structure, and the first surface S1 of the first end EP1 of the second abnormal light emitting elements LD_ABN2 may be larger than the second surface S2 of the second end EP2 thereof. In this case, due to the protruding structure formed by the second protruding spacing patterns IPP2, the second abnormal light emitting elements LD_ABN2 may be spaced from the insulating layer INS (e.g., the first insulating layer INS1) in an area adjacent to the first end EP1. For example, a diameter of the first surface S1 may be larger than the second distance 140, and accordingly, the second abnormal light emitting elements LD_ABN2 may be disposed on the second protruding spacing patterns IPP2 adjacent to each other so as to avoid physical contact with the insulating layer INS (e.g., the first insulating layer INS1). Accordingly, the second abnormal light emitting elements LD_ABN2 may be spaced from each other with the insulating layer INS and a step area SFA interposed therebetween. In one or more embodiments, the second abnormal light emitting elements LD_ABN2 and the second electrode ALE2 may be spaced from each other with the insulating layer INS and a step area SFA interposed therebetween. In one or more embodiments, after the light emitting elements LD are supplied (or disposed), the connecting electrodes ELT are patterned, so that the connecting electrodes ELT may be patterned on the second abnormal light emitting elements LD_ABN2 and the insulating layer INS whose positions are defined on the step area SFA. In this case, when a conductive layer for forming the connecting electrodes ELT is patterned on the second abnormal light emitting elements LD_ABN2, a portion of the conductive layer is patterned on the second abnormal light emitting elements LD_ABN2 to form the isolated portion IS, but the other portion of the conductive layer may be patterned on the insulating layer INS (for example, the first insulating film INS1) spaced from the second abnormal light emitting elements (LD_ABN2) to form the second base portion B2. In this case, the isolated portion IS and the second base portion B2 may be spaced from each other with a cavity CAV therebetween and may be electrically separated from each other, in a plan view. That is, due to the step area SFA, in the area adjacent to the second abnormal light emitting elements LD_ABN2, the isolated portion IS may be formed without forming the second protruding portion P2 connected to the second base portion B2, and eventually, the second abnormal light emitting elements LD_ABN2 may not define a current path.

In one or more embodiments, a height of the step area SFA may be greater than the diameter of the first surface S1 of the light emitting element LD. In this case, the isolated portion IS and the second base portion B2 may be more clearly electrically separated from each other.

As a result, because the current path is not defined in the abnormally aligned first and second abnormal light emitting elements LD_ABN1 and LD_ABN2, a short circuit defect in the pixel PXL according to one or more embodiments may be substantially prevented or reduced.

Hereinafter, a manufacturing method of the display device DD according to one or more embodiments will be described with reference to FIG. 26 to FIG. 31. Descriptions that may be redundant to those described above are simplified or are not repeated.

Figure 26:
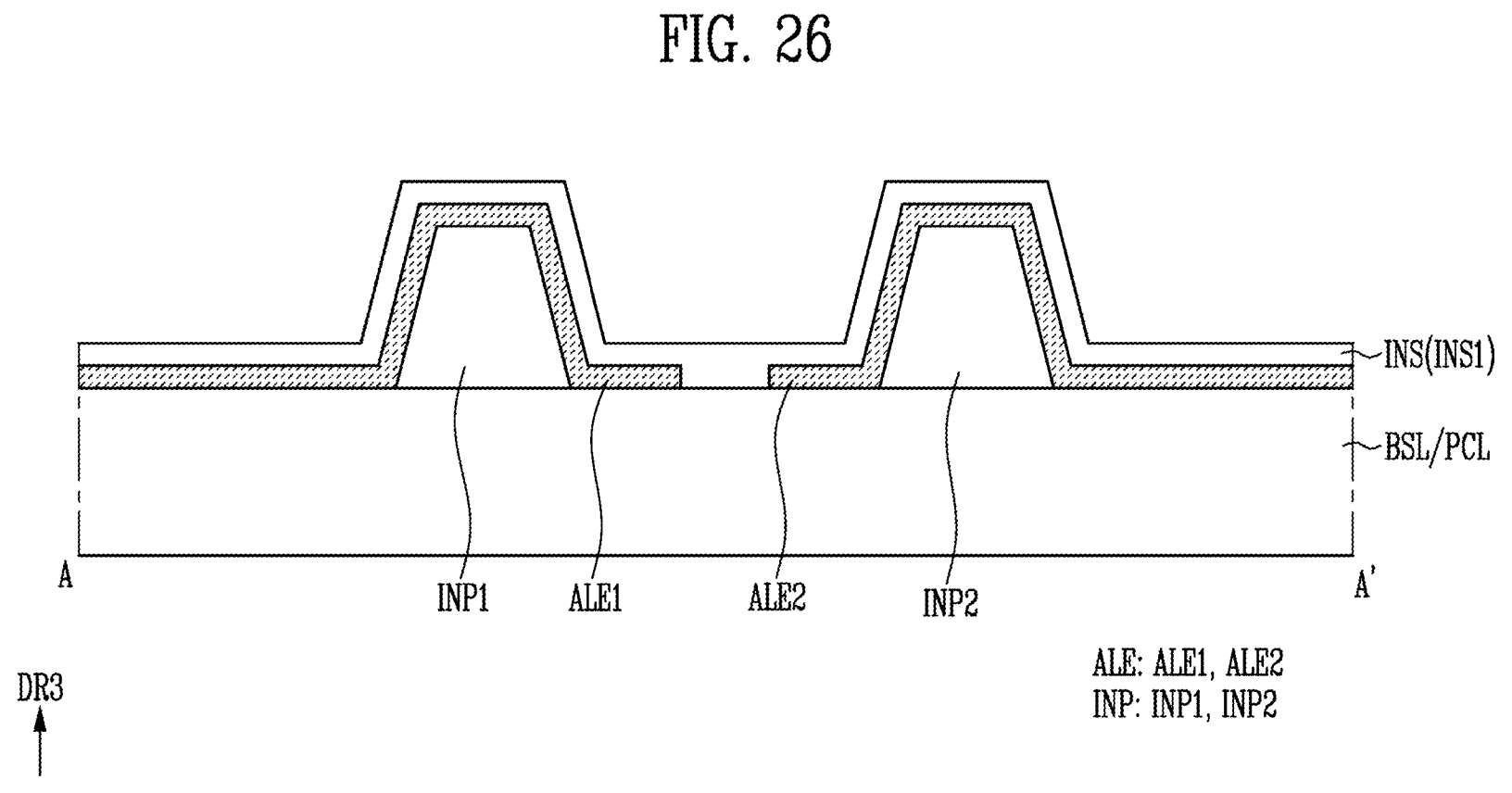
Figure 28:
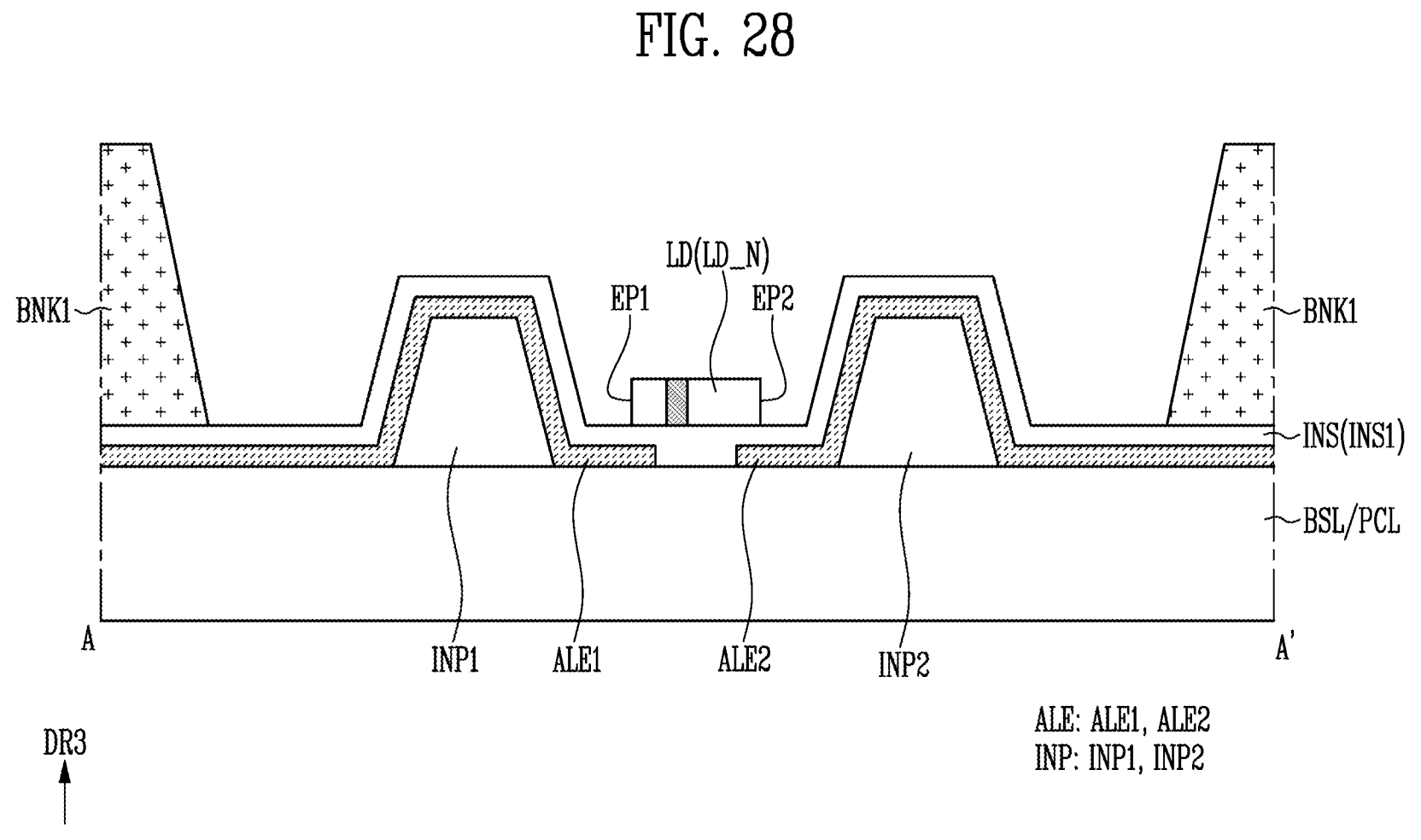
Figure 31:
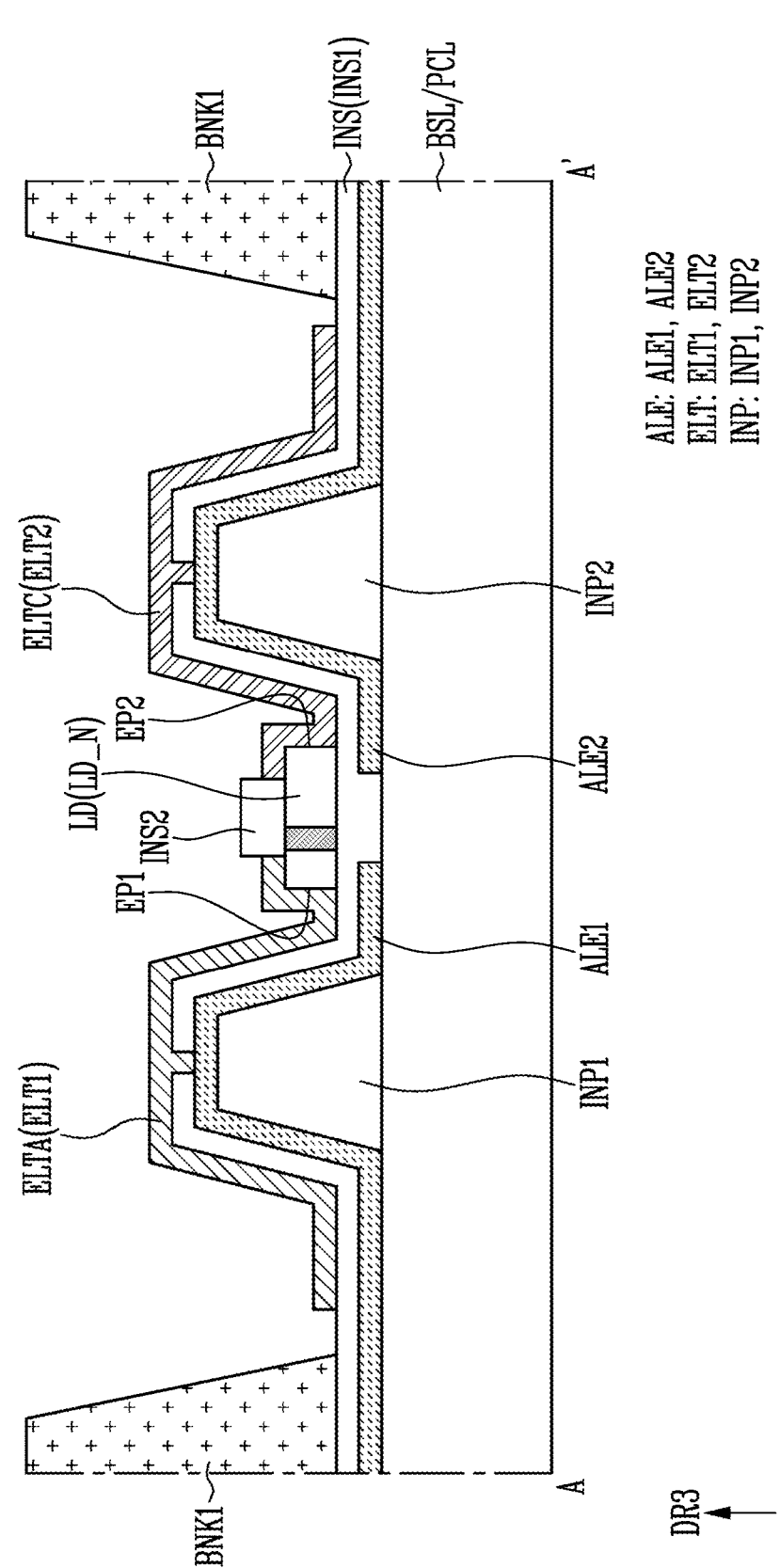

FIG. 26, FIG. 28, and FIG. 31 illustrate schematic cross-sectional views of process steps of a manufacturing method of a display device according to one or more embodiments. FIG. 26, FIG. 28, and FIG. 31 mainly illustrate the cross-sectional structure described above with reference to FIG. 9. In FIG. 26, FIG. 28, and FIG. 31, the base layer BSL and the pixel circuit layer PCL are simply illustrated for better understanding and ease of description.

Figure 27:
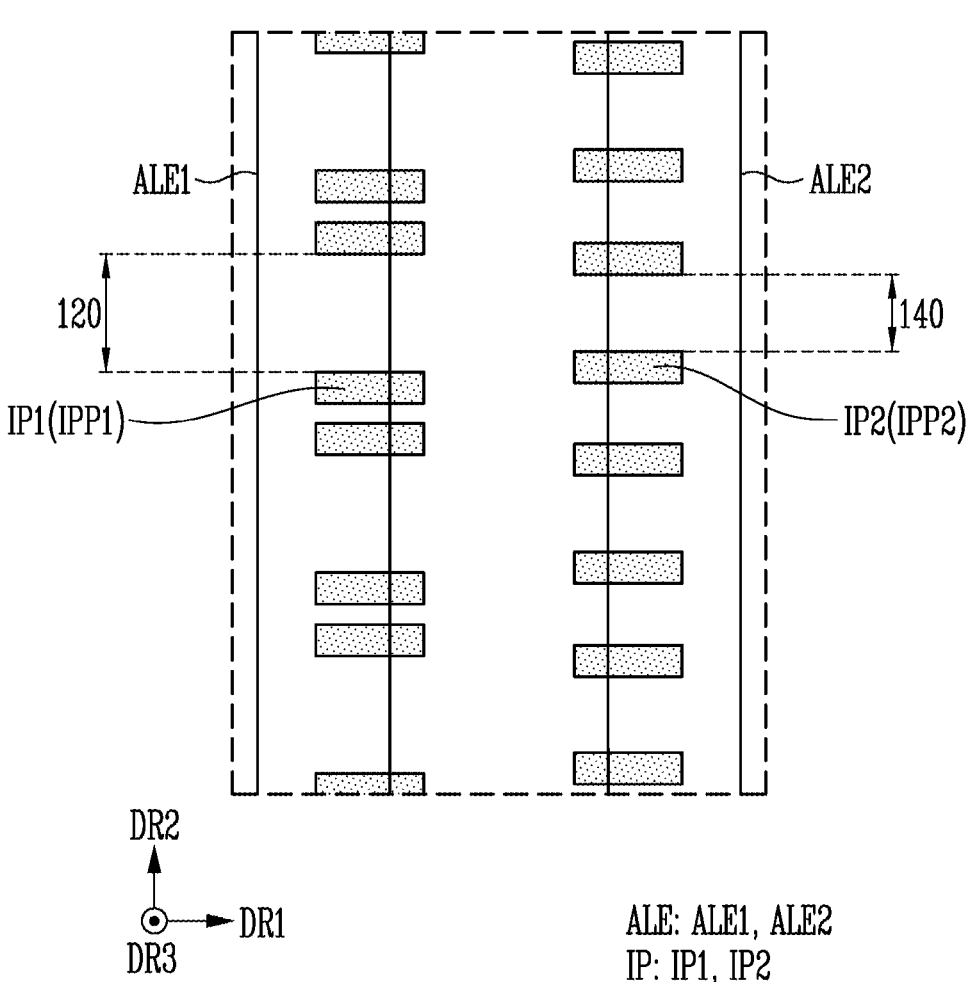
FIG. 27, FIG. 29, and FIG. 30 illustrate schematic top plan views of process steps of a manufacturing method of a display device according to one or more embodiments.
Figure 29:
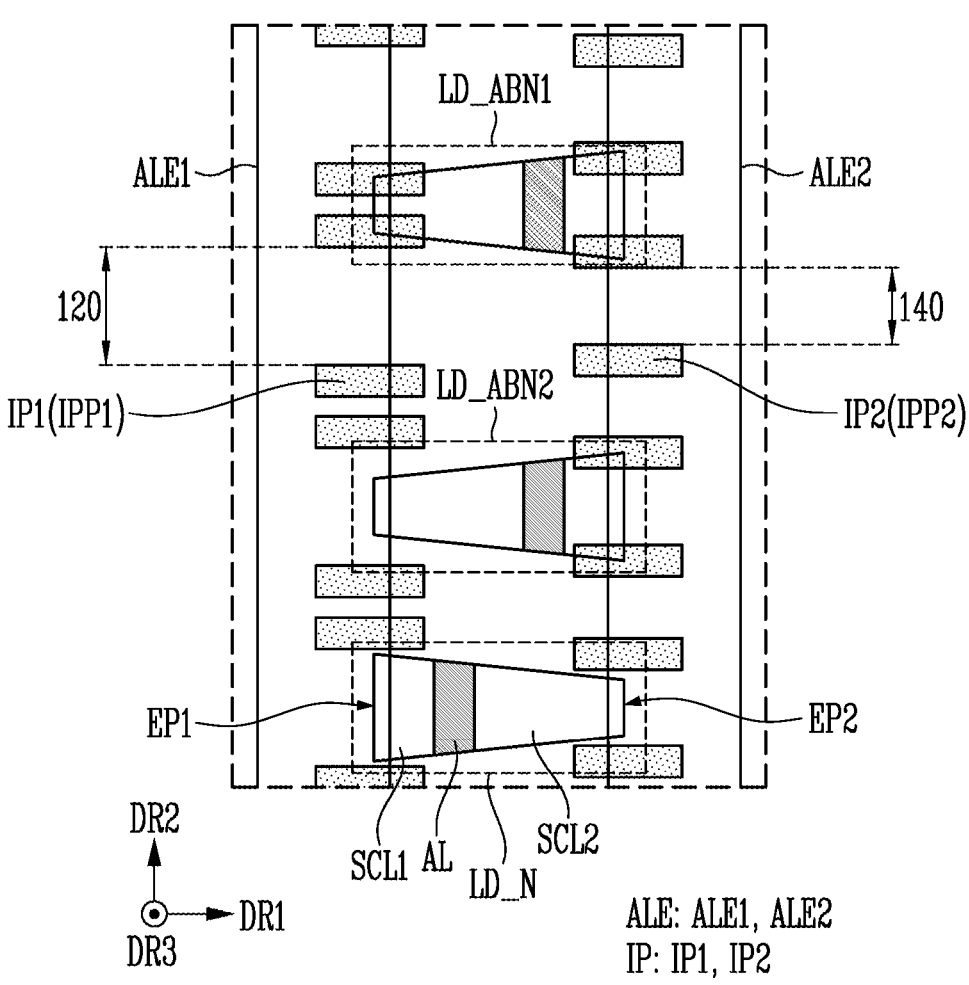
Figure 30:
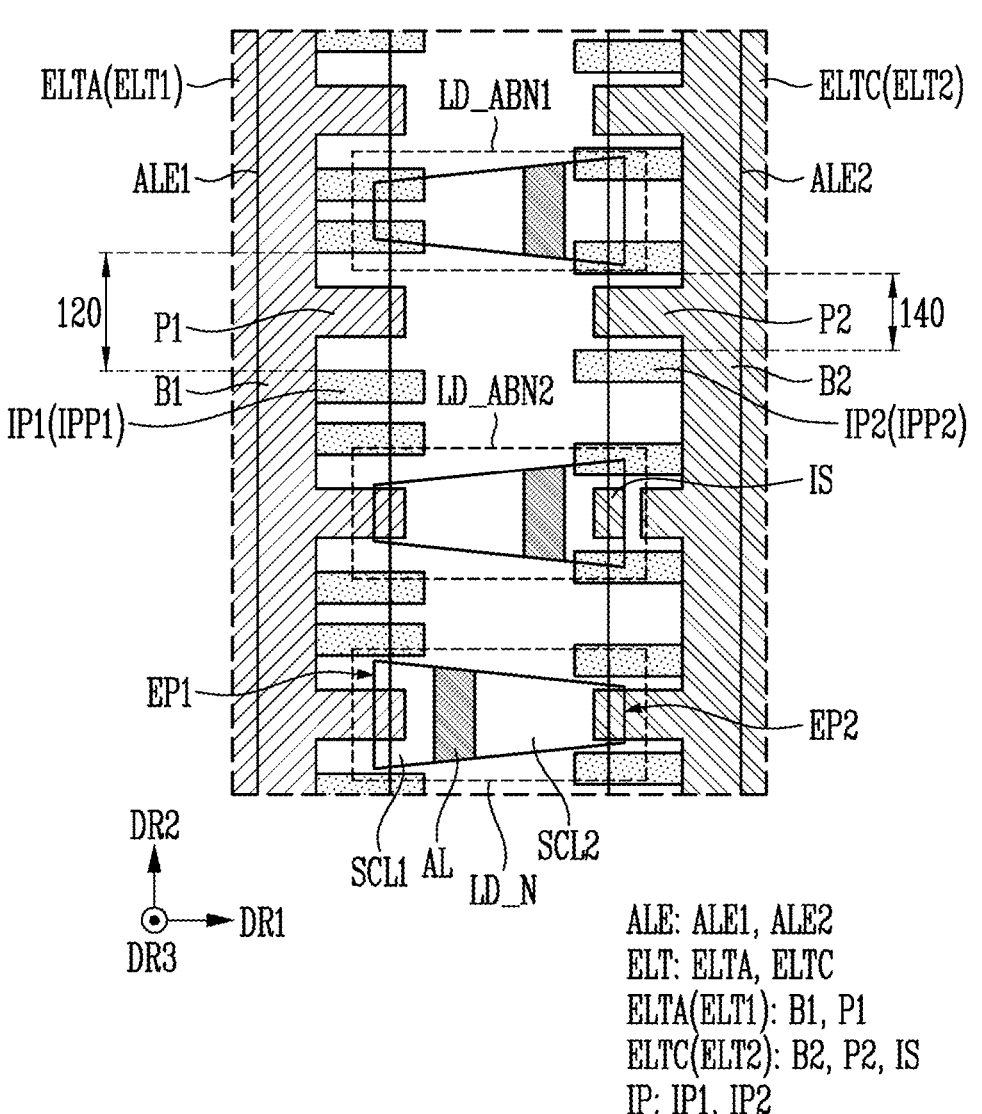

FIG. 27, FIG. 29, and FIG. 30 illustrate schematic top plan views of process steps of a manufacturing method of a display device according to one or more embodiments. FIG. 27, FIG. 29, and FIG. 30 mainly illustrate the planar structure described above with reference to FIG. 14.

Referring to FIG. 26 and FIG. 27, the base layer BSL may be provided (or prepared), and the pixel circuit layer PCL may be disposed on the base layer BSL. In addition, the insulating pattern INP may be disposed (or patterned) on the pixel circuit layer PCL, the electrodes ALE may be disposed (or patterned) on the insulating pattern INP, and the insulating layer INS may be disposed (or patterned) on the electrodes ALE.

The components (for example, the pixel circuit layer PCL and the like) disposed on the base layer BSL are typically formed by patterning a conductive layer (or a metal layer), an inorganic material, or an organic material by performing a process using a mask.

In the present phase, after the base electrode is deposited on the pixel circuit layer PCL, at least a portion of the base electrode may be etched to pattern the first electrode ALE1 and the second electrode ALE2. In one or more embodiments, the electrodes ALE may be deposited on the insulating patterns INP to form a reflective wall. In one or more embodiments, the first electrode ALE1 and the second electrode ALE2 may extend in the second direction DR2 and may be patterned to be spaced from each other in the first direction DR1. Accordingly, an area in which the light emitting elements LD may be disposed may be defined between the first electrode ALE1 and the second electrode ALE2.

In the present phase, in order to form the insulating layer INS, the first insulating film INS1 may be patterned, and the protruding patterns IP may be patterned. In one or more embodiments, the first insulating film INS1 and the protruding patterns IP may be simultaneously patterned. For example, the protruding patterns IP may be patterned by using a halftone mask disposed to correspond to an area in which the protruding patterns IP are to be disposed. Alternatively, in one or more embodiments, the first insulating film INS1 and the protruding patterns IP may be patterned in different processes. For example, the first insulating film INS1 and the protruding patterns IP may be patterned by using different masks in different processes. In one or more embodiments, the protruding patterns IP may be patterned after the first insulating film INS1 is patterned, or the first insulating film INS1 may be patterned after the protruding patterns IP are patterned.

In the present phase, as a subsequent process is performed, the first protruding spacing patterns IPP1 that are spaced from each other by the first distance 120 may be patterned so that the first protruding patterns IP1 do not overlap the first protruding portion P1. As a subsequent process is performed, the second protruding spacing patterns IPP2 that are spaced from each other by the second distance 140 may be patterned so that the second protruding patterns IP2 do not overlap the second protruding portion P2. In one or more embodiments, in order to manufacture the pixel PXL according to the second embodiment (see FIG. 17) and the third embodiment (see FIG. 19), the structures of the first and second protruding spacing patterns IPP1 and IPP2 may be differently patterned.

Referring to FIG. 28 and FIG. 29, the first bank BNK1 may be disposed on the insulating layer INS (e.g., the first insulating layer INS1), and the light emitting elements LD may be disposed (or provided) on the base layer BSL (or the insulating layer INS).

In the present phase, ink including the light emitting elements LD may be supplied into a space where a fluid defined by the first bank BNK1 may be accommodated. For example, the ink including the light emitting elements LD and a solvent may be supplied onto the base layer BSL by a printing device configured to eject a fluid. In one or more embodiments, the solvent may include an organic solvent. For example, the solvent may be one of propylene glycol methyl ether acetate (PGMEA), dipropylen glycol n-propyl ether (DGPE), and triethylene gylcol n-butyl ether (TGBE). However, the present disclosure is not limited to the example described above.

In the present phase, the ink may be accommodated in the space defined by the first bank BNK1, alignment signals may be supplied to the electrodes ALE, and the light emitting elements LD may be aligned based on an electric field according to the alignment signals. As described above, the first alignment signal is supplied to the first electrode ALE1, and the second alignment signal is supplied to the second electrode ALE2, so that the light emitting elements LD may be aligned between the first electrode ALE1 and the second electrode ALE2.

In the present phase, some of the light emitting elements LD may be normally aligned to be provided as the normal light emitting elements LD_N, and some other light emitting elements LD may be abnormally aligned to be provided as the first and second abnormal light emitting elements LD_ABN1 and LD_ABN2. For example, some of the light emitting elements LD (that is, the normal light emitting element LD_N) may be aligned so that the first end EP1 may oppose the first electrode ALE1 and the second end EP2 may oppose the second electrode ALE2, and in this case, as a subsequent process of forming the connecting electrodes ELT is performed, the current path may be clearly defined. However, some other light emitting elements LD (that is, the first and second abnormal light emitting elements LD_ABN1 and LD_ABN2) may be aligned so that the first end EP1 may oppose the second electrode ALE2 and the second end EP2 may oppose the first electrode ALE1.

In the present phase, a portion corresponding to the first end EP1 of the normal light emitting elements LD_N may be provided between the first protruding spacing patterns IPP1 that are spaced from each other by the first distance 120, and a portion corresponding to the second end EP2 of the normal light emitting elements LD_N may be provided between the second protruding spacing patterns IPP2 that are spaced from each other by the second distance 140.

In the present phase, a portion corresponding to the second end EP2 of the first abnormal light emitting elements LD_ABN1 may contact the first protruding spacing patterns IPP1, and a portion corresponding to the first end EP1 of the first abnormal light emitting elements LD_ABN1 may contact the second protruding spacing patterns IPP2.

In the present phase, a portion corresponding to the first end EP1 of the second abnormal light emitting elements LD_ABN2 may be disposed on the protruding structure of the second protruding spacing patterns IPP2, and a portion corresponding to the second end EP2 of the second abnormal light emitting elements LD_ABN2 may be disposed between the first protruding spacing patterns IPP1.

Referring to FIG. 30 and FIG. 31, the connecting electrode ELT including the anode connecting electrode ELTA and the cathode connecting electrode ELTC may be patterned. In one or more embodiments, the second insulating layer INS2 may be disposed on the light emitting elements LD, and then the connecting electrode ELT may be deposited.

In the present phase, a conductive layer may be deposited so that the first protruding portion P1 may be patterned between the first protruding spacing patterns IPP1 and the second protruding portion P2 may be patterned between the second protruding spacing patterns IPP2.

In the present phase, the normal light emitting elements LD_N may be electrically connected to the first protruding portion P1 and the second protruding portion P2, and a normal current path may be formed.

In the present phase, because the first abnormal light emitting elements LD_ABN1 are disposed to avoid the position for patterning the first and second protruding portions B1 and B2, they may not be electrically connected between the anode connecting electrode ELTA and the cathode connecting electrode ELTC.

In the present phase, the isolated portion IS may be formed without forming the second protruding portion P2 in the area adjacent to the first end EP1 of the second abnormal light emitting elements LD_ABN2, and accordingly, the second abnormal light emitting elements LD_ABN2 may not form a normal current path between the anode connecting electrode ELTA and the cathode connecting electrode ELTC.

As a result, according to one or more embodiments, the degree of alignment of the light emitting elements LD may be improved, and the predictability of the alignment process of the light emitting elements LD may be improved. In addition, because the electrical connection between the light emitting elements LD and the connecting electrodes ELT is defined with high reliability, the luminous efficiency of the pixel PXL may be improved. Further, even when some of the light emitting elements LD are abnormally arranged, the formation of an abnormal electrical connecting structure is substantially prevented, thereby preventing short-circuit defects.

While the present disclosure has been shown and described with reference to certain embodiments thereof, it will be understood by those skilled in the art that various changes in forms and details may be made therein without departing from the spirit and scope of the present disclosure as defined by the appended claims and their equivalents.

Therefore, the technical scope of the present disclosure may be determined by the technical scope of the accompanying claims and their equivalents.

What is claimed is:

1. A display device comprising:
electrodes on a base layer;
an insulating layer on the electrodes and comprising a first protruding pattern and a second protruding pattern;
light emitting elements on the insulating layer, a light emitting element from among the light emitting elements comprising a first end and a second end, wherein the light emitting elements comprise a first light emitting element, the first end of the first light emitting element being adjacent to the first protruding pattern, and the second end of the first light emitting element being adjacent to the second protruding pattern;
a first connecting electrode electrically connected to the first end of the first light emitting element and comprising a first base portion and first protruding portions connected to the first base portion; and
a second connecting electrode electrically connected to the second end of the first light emitting element and comprising a second base portion and second protruding portions connected to the second base portion,
wherein the light emitting elements comprise a first surface having a first area at the first end and a second surface having a second area smaller than the first area at the second end,
wherein the first protruding pattern comprises first protruding spacing patterns spaced from each other by a first distance with one of the first protruding portions therebetween,
wherein the second protruding pattern comprises second protruding spacing patterns spaced from each other by a second distance with one of the second protruding portions therebetween, and
wherein the first distance is greater than the second distance.

2. The display device of claim 1, wherein the light emitting element comprises:
a first semiconductor layer adjacent to the first end and comprising a p-type semiconductor; a second semiconductor layer adjacent to the second end and comprising an n-type semiconductor; and an active layer between the first semiconductor layer and the second semiconductor layer,
wherein the light emitting element has an asymmetrical shape with respect to a direction from the first end toward the second end.

3. The display device of claim 1, wherein the first protruding portions and the second protruding portions respectively form pairs.

4. The display device of claim 3, wherein:
the first protruding portion overlaps the first end of the light emitting element in a plan view; and
the second protruding portion overlaps the second end of the light emitting element in the plan view.

5. The display device of claim 1, further comprising a first power line configured to supply a first power voltage to the first light emitting element; and a second power line configured to supply a second power voltage different from the first power voltage to the first light emitting element,
wherein the first connecting electrode electrically connects the first power line and the first end of the first light emitting element, and the second connecting electrode electrically connects the second power line and the second end of the first light emitting element.

6. The display device of claim 5, wherein:
the first end of the first light emitting element contacts the first protruding portion without physically contacting the first base portion; and
the second end of the first light emitting element contacts the second protruding portion without physically contacting the second base portion.

7. The display device of claim 1, wherein:
the first protruding spacing patterns form a first groove area;
the second protruding spacing patterns form a second groove area;
the insulating layer comprises a first insulating film covering the electrodes;
a portion of the first end of the first light emitting element contacts the first insulating film in the first groove area; and
a portion of the second end of the first light emitting element contacts the first insulating film in the second groove area.

8. The display device of claim 1, wherein:
the first protruding spacing patterns are between the first protruding portions; and
the second protruding spacing patterns are between the second protruding portions.

9. The display device of claim 1, wherein:
one of the first protruding spacing patterns is between the first protruding portions; and
one of the second protruding spacing patterns is between the second protruding portions.

10. The display device of claim 9, wherein:
the first protruding spacing patterns have a first length;
the second protruding spacing patterns have a second length; and
the first length is smaller than the second length.

11. The display device of claim 1, wherein one or more of the first protruding spacing patterns and one or more of the second protruding spacing patterns are integrally formed to provide a protruding spacing pattern extending in a direction from the first end toward the second end.

12. The display device of claim 11, wherein:
the protruding spacing pattern has a trapezoidal shape; and
a diagonal direction in which a side surface of the protruding spacing pattern extends is same as a diagonal direction in which a side surface of the first light emitting element extends.

13. The display device of claim 1, wherein:
the light emitting elements comprise a second light emitting element, wherein the first end of the second light emitting element facing the second connecting electrode and the second end of the second light emitting element facing the first connecting electrode; and the second light emitting element do not correspond to a pair formed by the first protruding spacing patterns and the second protruding spacing patterns, and do not electrically connect the first connecting electrode and the second connecting electrode.

14. The display device of claim 1, wherein:

the light emitting elements comprise a third light emitting element, the first end of the third light emitting element facing the second connecting electrode and the second end of the third light emitting element facing the first connecting electrode; and the third light emitting element is physically spaced from the second base portion, and do not electrically connect the first connecting electrode and the second connecting electrode.

15. The display device of claim 14, wherein:

the insulating layer comprises a first insulating film covering the electrodes;

a diameter of the first end of the third light emitting element is smaller than a distance between the second protruding spacing patterns adjacent to each other; and a portion adjacent to the first end of the third light emitting element is on the adjacent second protruding spacing patterns to be spaced from the first insulating film.

16. The display device of claim 15, wherein:

the second connecting electrode comprises an isolated portion physically spaced from the second base portion; and the third light emitting element contacts the isolated portion.

17. A manufacturing method of a display device, comprising:

patterning electrodes on a base layer;

disposing an insulating layer on the electrodes;

disposing light emitting elements on the insulating layer; and patterning connecting electrodes such that one or more of the connecting electrodes are electrically connected to the light emitting elements, wherein the disposing of the insulating layer comprises disposing a first insulating film covering the electrodes, a first protruding pattern, and a second protruding pattern;

wherein the first protruding pattern comprises first protruding spacing patterns that are spaced from each other by a first distance;

wherein the second protruding pattern comprises second protruding spacing patterns that are spaced from each other by a second distance;

wherein the patterning of the connecting electrodes comprises: patterning a first base portion and first protruding portions connected to the first base portion; and patterning a second base portion and second protruding portions connected to the second base portion;

wherein the first protruding portions are between the first protruding spacing patterns adjacent to each other;

wherein the second protruding portions are between the second protruding spacing patterns adjacent to each other;

wherein the light emitting element comprises a first end and a second end, and has an asymmetrical shape with respect to a direction from the first end toward the second end; and wherein the first distance is larger than the second distance.

18. The manufacturing method of the display device of claim 17, wherein:

the disposing of the light emitting elements comprises: supplying an alignment signal to the electrodes, and aligning the light emitting elements based on an electric field according to the alignment signal; and the patterning of the connecting electrodes is performed after the patterning of the electrodes.

19. The manufacturing method of the display device of claim 17, wherein:

the disposing of the light emitting elements comprises: disposing first light emitting elements; disposing second light emitting elements; and disposing third light emitting elements;

the disposing of the second light emitting elements comprises disposing the second light emitting elements such that they do not correspond to pairs formed by the first protruding portions and the second protruding portions; and the disposing of the third light emitting elements comprises disposing the first end of the third light emitting elements to be directed to the second base portion and the second end of the third light emitting elements to be directed to the first base portion.

20. The manufacturing method of the display device of claim 19, wherein:

the patterning of the connecting electrodes comprises patterning an isolated portion to be adjacent to the first end of the third light emitting elements; and the isolated portion is physically spaced from the second base portion.

* * * * *